United States Patent [19]

van der Werf et al.

[11] Patent Number: 5,191,200
[45] Date of Patent: Mar. 2, 1993

[54] IMAGING APPARATUS HAVING A FOCUS-ERROR AND/OR TILT DETECTION DEVICE

[75] Inventors: Jan E. van der Werf; Marinus A. van den Brink, both of Eindhoven; Henk F. D. Linders, Dommelen; Johannes M. M. Beltman, Veldhoven, all of Netherlands

[73] Assignee: U.S. Philips Corp., New York, N.Y.

[21] Appl. No.: 808,340

[22] Filed: Dec. 16, 1991

[30] Foreign Application Priority Data

Mar. 7, 1991 [NL] Netherlands ............... 9100410

[51] Int. Cl.⁵ .................................................. G01J 1/20
[52] U.S. Cl. .................................. 250/201.4; 250/548
[58] Field of Search ............... 250/201.2, 201.4, 201.7, 250/201.8, 204, 548, 557, 237 R, 237 G; 356/399, 400, 401

[56] References Cited

U.S. PATENT DOCUMENTS 4,650,983  3/1987  Suwa ............................ 250/204
5,008,705  4/1991  Sindledecker ............... 250/548
5,015,866  5/1991  Hayashi ....................... 250/548

Primary Examiner—David C. Nelms
Assistant Examiner—K. Shami
Attorney, Agent, or Firm—Steven R. Biren

[57] ABSTRACT

An imaging apparatus has an imaging system (PL) and a focus detection device for determining a deviation between the image plane of the imaging system and a second plane (WS) on which imaging is to take place. The focus error detection system includes a radiation source (S) which supplies a beam ($b_f$) having a wide wavelength band, an object grating ($G_1$) and an image grating ($G_2$) which are imaged onto each other via the second plane. In the focus detection system a reference beam ($b_r$) which is reflected by the outer surface (RP) of the imaging system can be used in combination or not in combination with the wideband beam and the gratings. By using a number of such focus detection systems a tilt detection device can be realized for detecting the position of the second plane (WS) with respect to the image plane.

52 Claims, 17 Drawing Sheets

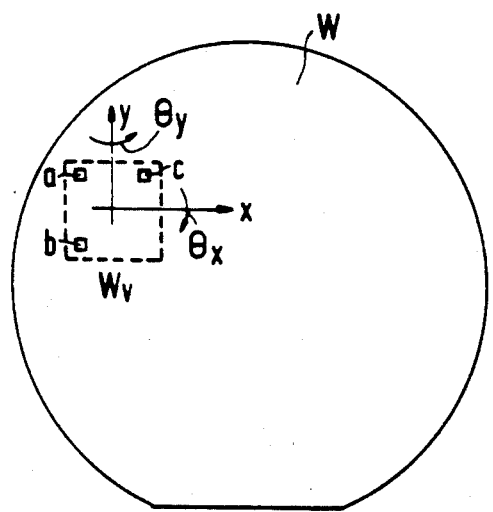
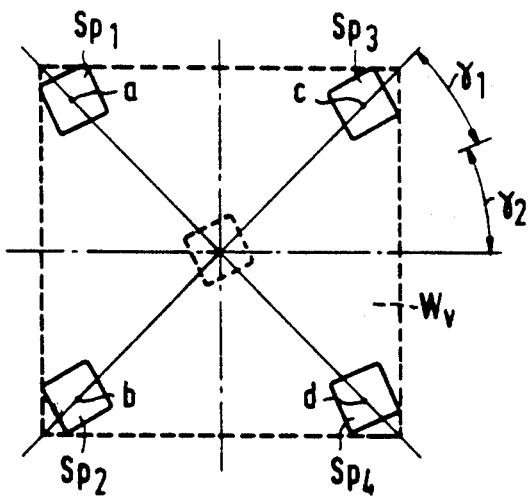
FIG.16a  FIG.16b
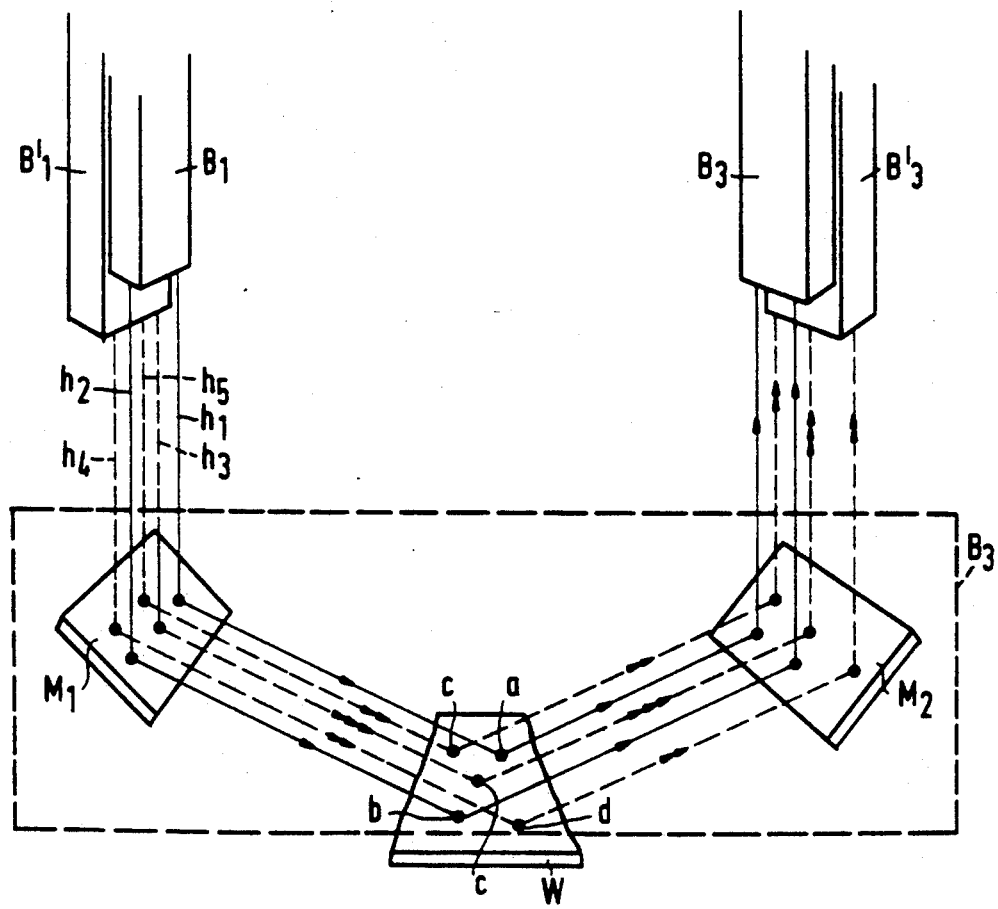
FIG.17

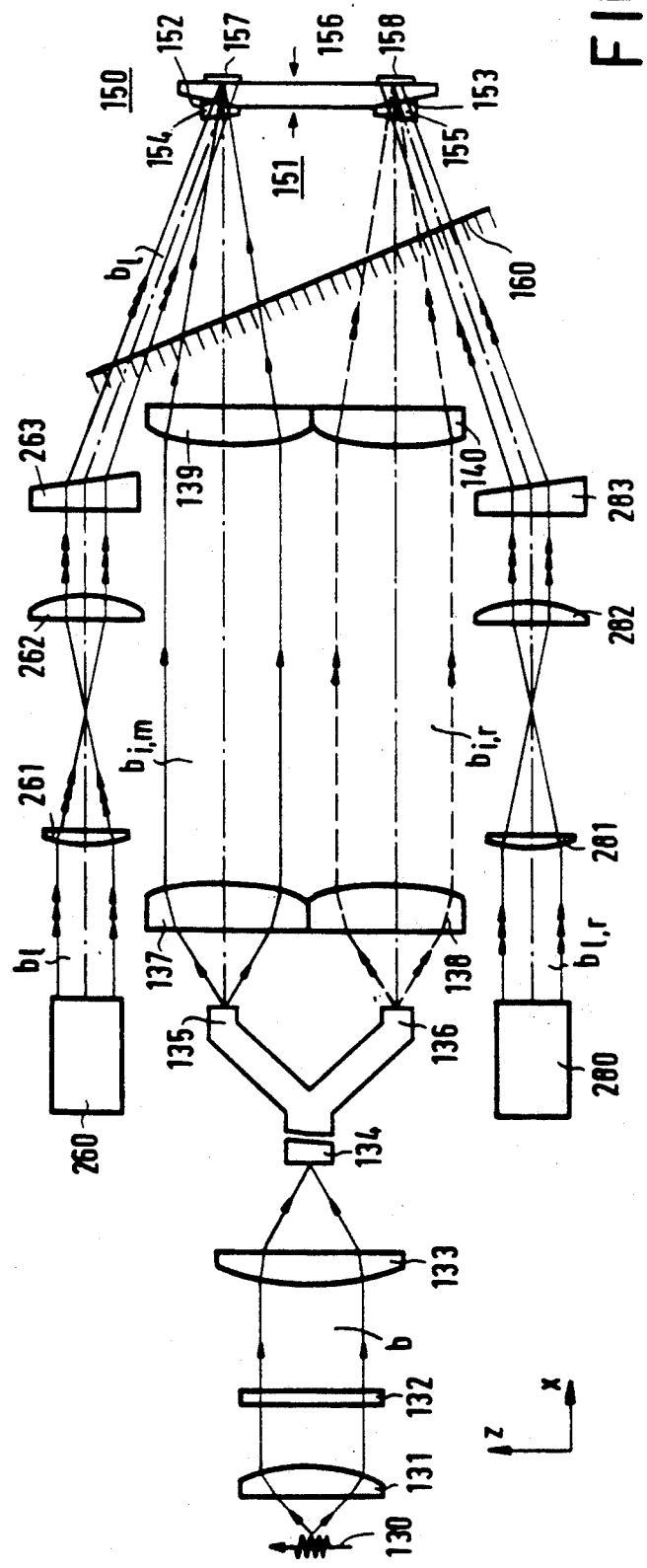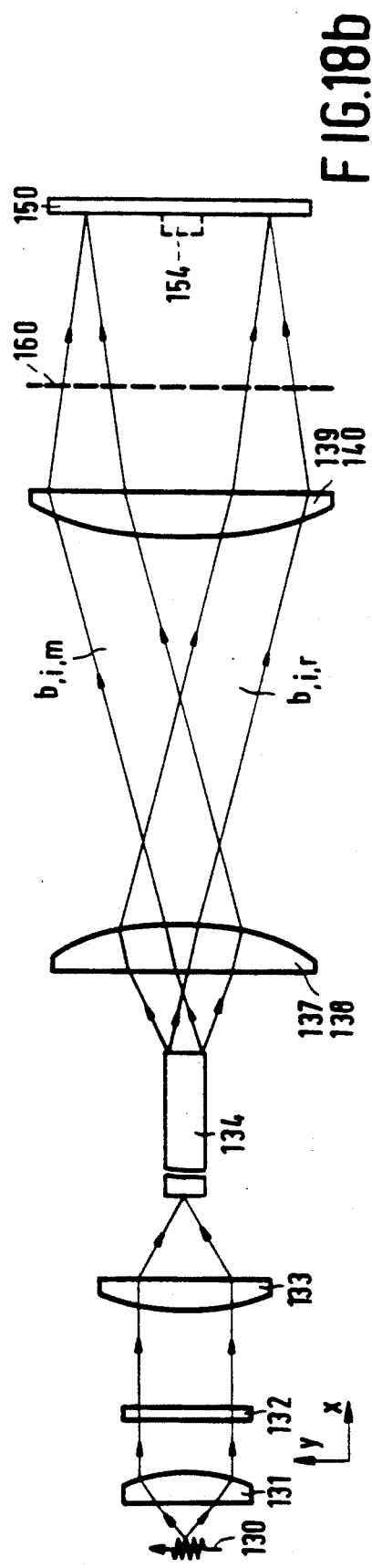

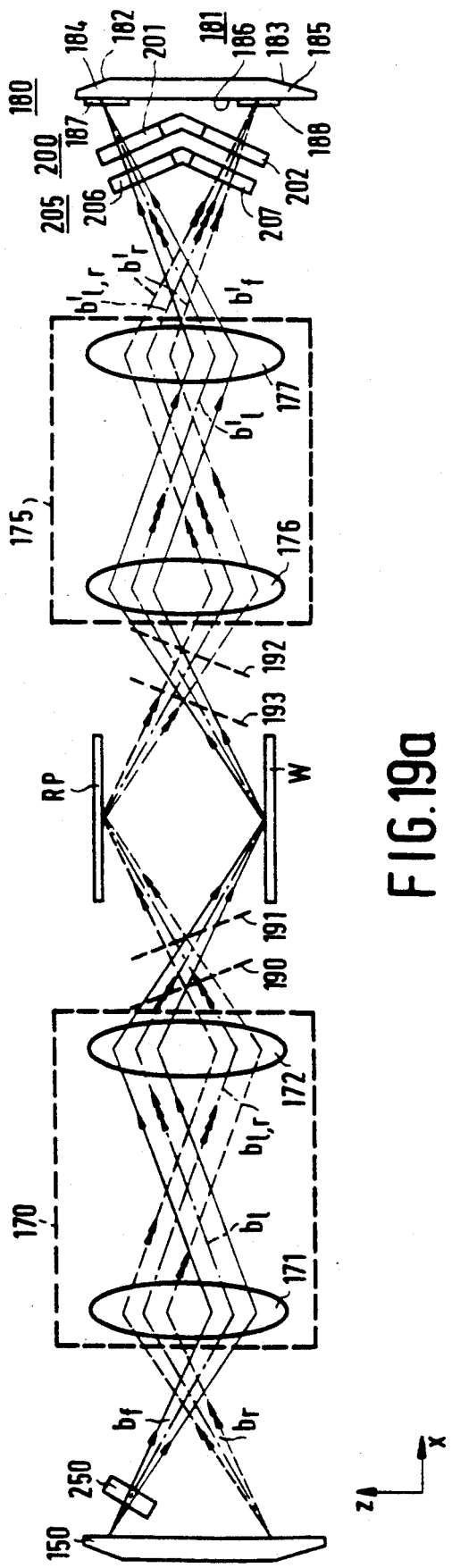
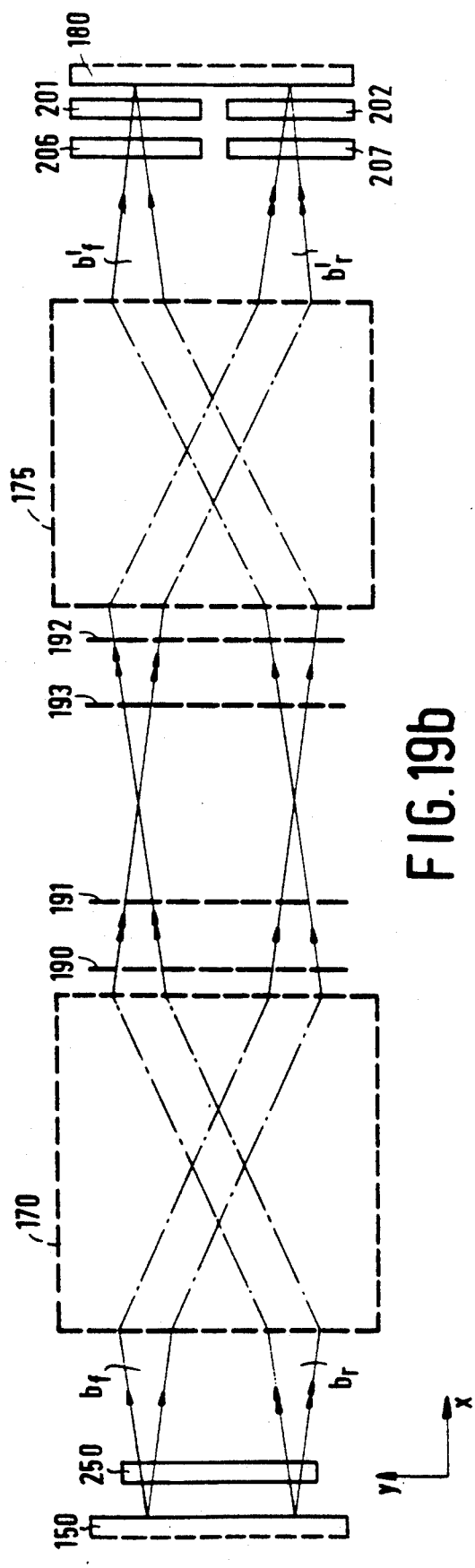
FIG.19a
FIG.19b

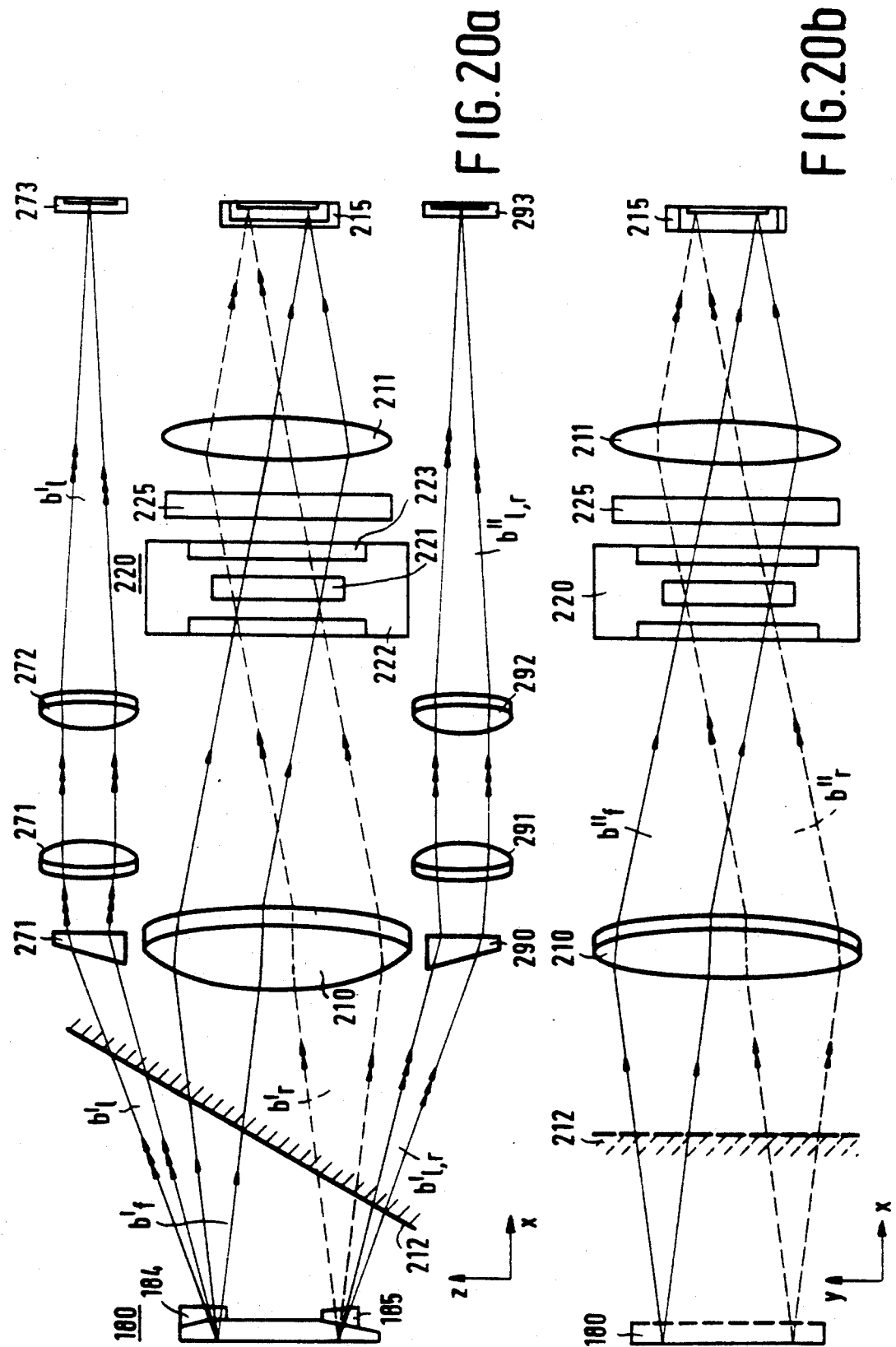

IMAGING APPARATUS HAVING A FOCUS-ERROR AND/OR TILT DETECTION DEVICE

BACKGROUND OF THE INVENTION

The invention relates to an imaging apparatus comprising an imaging system and an opto-electronic focus detection system for determining a deviation between the image plane of the imaging system and a second plane on which imaging is to take place, said focus detection system comprising a radiation source for supplying a focus detection beam, a radiation-sensitive detector arranged at the same side of the second plane as the radiation source, and optical elements for directing the focus detection beam onto the second plane at a small angle to said plane for changing the vergence of said beam and of that of the beam reflected by the second plane and for directing the last-mentioned beam onto the detector.

An imaging apparatus of this type is known from, for example, U.S. Pat. No. 4,866,262. The apparatus described in this previous Patent may be part of what is commonly referred to as "wafer stepper", i.e. a machine for repetitively imaging a mask pattern on a substrate, for example, a silicon substrate by means of optical radiation, which machine is used in the manufacture of, for example, integrated circuits, briefly referred to as ICs. The pattern is imaged on a first sub-area, or field, of the substrate by means of a projection lens system and subsequently the substrate is moved over an accurately defined distance whereafter the pattern is imaged on a second substrate field, whereafter the substrate is moved again, and so forth until the pattern is imaged on all substrate fields.

Due to the fineness of the details which must be imaged, the projection lens system should have a large numerical aperture. However, such a lens system has a small depth of focus so that a deviation between the image plane of the projection lens system and the substrate surface must be accurately measured and possibly corrected. Said measurement is generally referred to as focus detection. Another problem is that the substrate surface may be arranged obliquely due to tilt of the substrate as a whole or thickness variations of this substrate. Moreover, the substrate surface may have local unevennesses. It is therefore necessary to perform a focus detection for each substrate field.

In the apparatus described in U.S. Pat. No. 4,866,262 the focus detection is performed with the aid of a laser beam which is incident on the substrate surface at a large angle, for example, of the order of 80°, to the normal on this surface where it forms a first radiation spot. The substrate surface reflects the beam towards a radiation-sensitive detector comprising two detector cells and forms a second radiation spot in the plane of the detector, which spot is an image of the frist radiation spot. If the substrate surface coincides with the image plane of the projection lens system, the second radiation spot is located symmetrically with respect to the detector cells and the difference between the output signals of the detector cells is equal to zero. If the substrate surface does not coincide with said image plane, the second radiation spot is not located symmetrically with respect to the detector cells and said difference signal is unequal to zero. The magnitude and direction of a deviation between the substrate surface and the image plane of the projection lens system can be derived from the amplitude and the sign of this difference signal.

SUMMARY OF THE INVENTION

It is an object of the present invention to provide a novel focus detection device which is more accurate and more reliable than existing devices and to provide a more extensive device of this type with which a local tilt of the substrate surface can be detected. This invention has several aspects which are already new of themselves and provide considerable improvements of the focus detection, but, if combined, also result in a novel generation of focus detection devices and local-tilt detection devices.

The different aspects of the invention embodied in different classes of embodiments will now be described with reference to the problems to which they provide a solution.

A first aspect relates to the focus detection beam. In known focus detection devices, such as those described in U.S. Pat. No. 4,866,262, this is a laser beam which is monochromatic and whose wavelength is chosen to be such that the beam does not influence the substrate surface to be exposed. However, this substrate has a varying number of layers in which the focus detection beam can penetrate so as to be subsequently reflected again. Due to interferences caused by the substrate layer packet variations occur in the focus detection beam, which variations are independent of the distance between the substrate surface and the image field of the projection lens system, so that an erroneous focus detection signal is obtained. Although it is ensured, by causing the focus detection beam to graze the substrate surface, i.e. to be incident on this surface at a small angle, that the reflection on the substrate surface is relatively large and the influence of the substrate layer packet on the focus detection beam is relatively small, the remaining influence of the substrate layer packet on the focus detection beam still plays an important role in the greater focus detection accuracy which is required nowadays.

To reduce this influence, a first class of embodiments of the imaging apparatus in accordance with a first aspect of the invention is characterized in that the focus detection beam has a wide wavelength band and in that a first and a second grating are provided, the first grating being arranged in the radiation path between the radiation source and the second plane and the second grating being arranged between said second plane and the detector.

Since the radiation of the focus detection beam has a wide spectrum and since said interference phenomena are different for each wavelength, the interferences are averaged out for the total beam so that the focus detection beam is no longer influenced by the substrate layer packet. Since with the use of radiation having a wide spectrum the dimension of the smallest radiation spot which can be formed on the substrate is larger than this dimension when using monochromatic radiation, and since the sensitivity, or resolving power, of the focus detection device is proportional to said dimension, the resolving power would decrease without any further measures. Still according to the invention, use is made of two gratings to prevent this, of which gratings one is imaged onto the other via reflection on the substrate. A grating displacement system is thereby created, whose sensitivity is proportional to the period of the gratings and with which very accurate measurements can be carried out.

It is to be noted that U.S. Pat. No. 4,650,983 describes an embodiment of a focus detection device for an IC projection apparatus in which a grating-onto-grating image is used. However, this device comprises two independently operating parts each individually supplying focus information. The first part operates with a beam extending outside the projection lens system and being obliquely incident on the substrate surface, which beam is not referred to as a wideband beam, and does not comprise any gratings. The second part of the focus detection device is intended for visual observation, through a television camera and a television monitor, of the state of the focus and operates with a beam which enters the projection lens system via a mask grating mark. The mask mark is imaged onto the substrat surface and subsequently re-imaged onto itself via reflection on the substrate surface. Since said beam has the same wavelength as the beam which is used for projecting the mask pattern on the substrate and should not cause any variations in the substrate surface, it must have a low intensity so that the quality of the focus error detection is influenced detrimentally.

The embodiment of the first class is preferably characterized in that means are provided for periodically moving, with respect to each other, the image of the first grating and the second grating perceived by the detector. The detector signals are now periodical signals and a dynamic and hence more reliable focus error signal is obtained.

Said periodical movement can be realized by periodically varying the height of the substrate or by periodically moving one of the gratings or another optical element. However, an embodiment of the first class of the apparatus is preferably further characterized in that an optical element controlled by a periodical electric signal is arranged in the path of the focus detection beam, an optical property of said element varying periodically under the influence of the electric signal.

It is then unnecessary to perform extra mechanical movements for obtaining a dynamic focus error signal.

It is to be noted that U.S. Pat. No. 4,614,864 describes a focus detection device for an IC projection apparatus in which an image, formed via the projection lens system and reflection on the substrate, of a pattern on a second, complementary pattern is oscillated for obtaining a dynamic focus error signal. In this device the focus detection beam traverses the projection lens system and is perpendicularly incident of the substrate. However, the first and second patterns are not separated gratings but the mask pattern and a pattern which is complementary thereto.

The preferred embodiment of the first class may be further characterized in that a polarization-sensitive element is arranged in front of the second grating for splitting the focus detection beam into two sub-beams which form images of the first grating in the plane of the second grating, said images being shifted with respect to each other over a distance which is equal to half the grating period of the second grating, in that a polarization rotator is arranged between the second grating and the detector, which rotator is controlled by a periodical signal for periodically varying the direction of polarization of the sub-beams, and in that a polarization analyser is arranged between the polarization rotator and the detector, the periodical signal being also applied to an electronic circuit for processing the output signal of the detector to a focus control signal.

Instead of this electro-optical modulator, other optical modulators such as a magneto-optical or an acousto-optical modulator can be used.

A special embodiment of the first class is characterized in that a retroreflector is arranged in the path of the focus detection beam reflected a first time by the second plane, which retroreflector reflects said beam along itself, and in that a beam-separating element is arranged between the second plane and the radiation source in the path of the focus detection beam reflected a second time by the second plane, said beam-separating element coupling out the twice-reflected beam towards the second grating and the detector arranged behind it.

Due to the double reflection of the focus detection beam at the same position of the second plane, or substrate, it is achieved that local differences in the reflection of the substrate do not have any influence on the focus error signal, while moreover the sensitivity of the focus detection device is increased by a factor of two.

In the known imaging apparatuses known, inter alia, from U.S. Pat. No. 4,866,262, the position of the height of the second plane, or substrate surface, is determined with respect to a mounting part in which the radiation source, the detector and other components of the focus detection device are secured. This mounting part is connected to the holder of the projection lens system. By moving the holder with respect to the mounting part or by moving optical elements in the mounting part, the radiation spot formed by the focus detection beam can move with respect to the image field of the projection lens system. A second aspect of the invention relates to the method in which an erroneous focus error signal produced as a result of said instabilities can be prevented.

A second class of embodiments of the image projection apparatus relating thereto has the common characteristic feature that a reference beam is provided which is directed onto a surface of the imaging system located opposite the second plane and extends at a small angle to this surface, and a second detector arranged in the path of the reference beam reflected by the surface, a first and a second grating being arranged in the path of the reference beam, and the optical means arranged between the first grating and the second grating for directing and changing the vergence being common for the two beams.

By defining the difference between the output signals of the two detectors, a signal is obtained which is only dependent on the distance between said lens surface and the second plane, which signal is not influenced by instabilities of the detection device because the focus detection beam and the reference beam traverse the same elements of the detection device.

It is to be noted that the article "Chip Levelling and Focusing with Laser Interferometry" in SPIE, Vol. 1264, Optical/Laser Microlithography III (1990), pp. 244–251 describes a device for local focus detection and tilt detection of a substrate in which a reference beam is used in addition to a focus detection beam reflected by the substrate. However, the first-mentioned beam is not reflected by a surface of the projection lens system so that it is not the distance between this lens surface and the substrate which is measured.

The second class of embodiments is preferably further characterized in that means are provided for the focus detection beam and the reference beam for periodically moving, with respect to each other, the image of the first and the second grating which are perceived by the detector for the relevant beam.

The advantages stated with reference to the first class of embodiments can then be obtained again. Said means may be constructed in the way as described in claims 8 and 9.

A first embodiment of the second class is further characterized in that a separate radiation source for supplying the reference beam is provided, in that a first beam-deflecting element is arranged between the radiation sources and the second plane in the path of the focus detection beam as well as of the reference beam for directing said beams onto the second plane and the surface of the imaging system, respectively, and in that a second beam-deflecting element is arranged between the second surface and the two detectors in the path of the focus detection beam as well as of the reference beam for directing said beams onto the first and the second detector, respectively.

The device can be given a compact form by using the deflection elements.

A second embodiment of the second class is further characterized in that a separate radiation source is provided for supplying the reference beam, in that a beam-deflecting element is arranged between the radiation sources and the second plane in the path of the focus detection beam as well as of the reference beam, in that a retroreflector is arranged in the path of the focus detection beam reflected a first time by the second plane and of the reference beam reflected a first time by the surface of the imaging system, and in that a first beam-separating element for coupling out the focus detection beam towards the first detector is arranged in the path of said beam reflected a second time by the second plane, while a second beam-separating element for coupling out the reference beam towards the second detector is arranged in the path of said beam reflected a second time by the surface of the imaging system.

Due to the double reflections on the second plane and on the surface of the imaging system the focus detection accuracy is increased by a factor of two, independently of local reflection differences of both the second plane and the surface of the imaging system.

The detection device may alternatively have only one radiation source.

A third embodiment of the second class, in which this is the case, is characterized in that a first birefringent element is arranged in the path of the beam supplied by the radiation source for splitting said beam into a focus detection beam having a first direction of polarization and a reference beam having a second direction of polarization and for directing said beams onto the second plane and the surface of the imaging system, respectively, and in that a second birefringent element is arranged in the paths of the beams reflected by the second plane and the surface of the imaging system, respectively, for deflecting the two beams towards each other and for directing the beams onto the first detector and the second detector, respectively.

As two birefringent elements are used, it is sufficient to use only one radiation source and, moreover, the device can be given a compact form.

A fourth embodiment of the second class is characterized in that a composite reflector is arranged in the path of the focus detection beam reflected by the second plane, in that the reference beam is formed by the beam reflected by the reflector and directed onto the surface of the imaging system and in that the first and the second detector are combined in one detector.

Since the beam incident on this detector has been in contact with the second plane as well as with the outer lens surface, this beam comprises information about the mutual distance between these planes. Instead of an electronic differentiation as in the previous embodiments an optical differentiation is now performed. Moreover, local refractive index differences due to, for example, turbulances of the medium in which the dual function beam propagates do not have any influence on the measuring signal.

The fourth embodiment may be further characterized in that a beam-deflecting element is arranged in the common path of the beam supplied by the radiation source and the beam reflected by the surface of the imaging system for deflecting the first-mentioned beam towards the second plane and for deflecting the last-mentioned beam towards the detector.

The device can be given a compact form by using the beam-deflecting element.

A fifth embodiment of the second class is characterized in that a first birefringent element is arranged in the path of the beam supplied by the radiation source, which element passes said beam as a focus detection beam towards the second plane, in that a second birefringent element is arranged in the path of the beam reflected by said plane, which element passes the reflected beam, in that a retroreflector reflecting the beam towards the second birefringent element is arranged in the path of the passed beam, which element deflects the beam as a reference beam towards the surface of the imaging system, and in that the first birefringent element deflects the beam reflected by said surface into the direction of the beam supplied by the radiation source.

A very attractive focus detection device according to the invention is obtained if characteristic features of the first class of embodiments are combined with characteristic features of the second class.

Such a device, which is based on the second class of embodiments, is characterized in that the focus detection beam has a wide wavelength band, in that a first grating is arranged in the radiation path of the focus detection beam as well as of the reference beam between the source supplying the relevant beam and the plane on which said beam is reflected for the first time, and in that a second grating is arranged between the detector for the relevant beam and a plane reflecting said beam towards the detector.

There are various embodiments of this device, which embodiments are analogous to the five embodiments of the second class, having as extra elements a plurality of gratings at different positions as described in claims 17 to 21.

The embodiments of the focus detection device according to the invention are preferably further characterized in that an adjustable optical element is arranged in front of the second plane in the radiation path of the focus detection beam for displacing, independently of a focus error, the radiation spot formed in the second plane for changing the zero of the generated focus error signal.

The adjustable element, which may be, for example, a tiltable plane-parallel plate or a movable auxiliary lens, can compensate for a displacement of the image plane of the imaging system resulting from a variation of an ambient parameter such as air pressure. Moreover, the operator of the imaging apparatus is enabled to set the zero of the focus error signal manually with reference to the results of experiments. The use of the adjustable element is known per se and described in detail in U.S. Pat. No. 4,866,262.

A third aspect of the present invention relates to a tilt detection device for detecting a tilt of the second plane with respect to the image plane of the imaging lens system, in which device use is made of the above-described aspects of the invention.

A tilt detection device using only the first aspect of the invention is characterized in that it comprises a first and a second detection unit each comprising a radiation source, a first and a second grating and a detector, the optical axis of the first unit being located in the XZ plane and the optical axis of the second unit being located in the YZ plane, and in that in each unit a first lens system is arranged in each unit between the first grating and the second plane for converting the beam from the grating into a parallel beam, while a second lens system is arranged between the second plane and the second grating for converting the parallel beam into a converging beam.

Since the beam is a parallel beam at the area of the second plane, a displacement of the second plane along the Z axis results in a displacement of the reflected beam parallel to itself. As a result, the image of the first grating shifts with respect to the second grating so that the detector signal changes.

This tilt detection device is preferably further characterized in that each detection unit comprises means for forming a reference beam which is directed onto a surface of the imaging system located opposite the second plane and extends at a small angle to said surface, and a second detector which is arranged in the path of the reference beam reflected by the surface of the imaging system.

The tilt of said surface of the imaging system can then also be determined. The means for forming the reference beam may be formed again by a separate radiation source or by a beam splitter, analogously as described with reference to the second class of embodiments.

A second main embodiment of the tilt detection device operating with beams focused on the second plane is characterized in that means for supplying at least two extra focus detection beams similar to said focus detection beam are provided for detecting tilts of the second plane about two mutually perpendicular X and Y axes of the image plane, in that each focus detection beam is directed onto a separate point of the second plane, at least two points taking up different X positions and at least two points taking up different Y positions.

The tilt detection can be performed very accurately by using a number of accurate focus detection devices for measuring at different points of the second plane.

It is to be noted that U.S. Pat. No. 4,504,144 describes a projection apparatus for repetitively imaging a mask pattern on a substrate, in which the tilt of the substrate is measured by performing a focus error detection at three points on the substrate and by comparing the results of the three measurements. The focus detection itself of the known apparatus with the aid of an image of a mask via the substrate on a detector by means of a beam through the projection lens system is, however, different from that according to the present invention.

In the last-mentioned embodiment of the apparatus according to the invention it is possible to use three separate focus error detection systems for defining the tilt of the substrate, or the second plane. However, this apparatus is preferably characterized by two separate focus detection units with two focus detection beams each, the detector signals of the two focus detection units jointly comprising information about the tilt of the second plane about the X axis and the Y axis.

An optimum state can then be achieved as regards the number of measuring points vs. the complexity of the device.

When using wideband focus detection beams in combination with gratings, the range within which focus errors can be detected is defined by the periods of the gratings, which periods should preferably as small as possible so as to be able to measure the focus error with great accuracy.

A first possibility of increasing said range is realised in an embodiment which is characterized in that each grating is divided into two sub-gratings which have different grating periods.

The grating period of a sub-grating is, for example, 10% larger than that of the other sub-grating. As described in the article "Automatic Alignment System for Optical Projection Printing" in IEEE Transactions on Electron Devices Vol. ED-26, No. 4, 1979, pp. 723-8, a signal is obtained by means of the two gratings, which signal has a period which is, for example, ten times larger than that of the signal obtained with a single grating.

A second embodiment of the device providing a larger measuring range and with which also tests and calibrations can be performed is characterized in that an additional, bright radiation source is provided for supplying an extra, monochromatic, focus detection beam for forming an extra radiation spot in the second plane. The extra radiation spot is located, for example, between and symmetrically relative to the other radiation spots. A small radiation spot with which the high resolution required for testing can be achieved can be formed with the monochromatic beam.

The device providing the bright, extra beam is preferably characterized by an additional, bright, monochromatic, reference beam for forming an extra radiation spot on the surface of the imaging system.

The distance between the imaging system and the second plane is then also measured by means of the extra beams and the influence of instabilities on the focus error signal generated by means of the monochromatic beam is minimized.

To limit the number of optical elements between the imaging lens system and the second plane, this device is characterized in that in each detection unit the optical elements in the radiation path between the gratings are common for all focus detection beams and reference beams.

Due to the wide wavelength bands of the focus detection and reference beams these elements must be corrected for chromatic aberrations. To limit the number of correction requirements imposed on these elements, the focus and tilt detection device is further characterized in that the wavelength of the monochromatic focus detection beam and reference beam is located in the wavelength band of the other focus detection beams and reference beams.

The focus and tilt detection device with four wideband and one monochromatic focus detection beam and reference beams may have a number of specific characteristic features as described in claims 32 and 33.

The invention also relates to a projection apparatus for repetitively imaging a mask pattern on a substrate, which apparatus comprises an imaging apparatus as described hereinbefore and in which the imaging lens system is formed by an optical projection lens system with which the pattern is projected onto the substrate, and the second plane is formed by the surface of a substrate layer to be exposed, the signals of the focus detection system being used for setting the distance between the substrate and the projection lens system and/or the angle between the image plane of said lens system and said surface.

BRIEF DESCRIPTION OF THE DRAWINGS

Embodiments of the invention will now be described in greater detail with reference to the accompanying drawing, in which:

FIGS. 16a and 16b show the principle of a tilt detection method based on multiple focus error detection, FIG. 17 shows the principle of a device for performing said method;

FIGS. 18a, 18b, 19a, 19b, 20a and 20b show, in a combination, an embodiment of such a tilt detection device.

DESCRIPTION OF THE PREFERRED EMBODIMENTS

Figure 1:
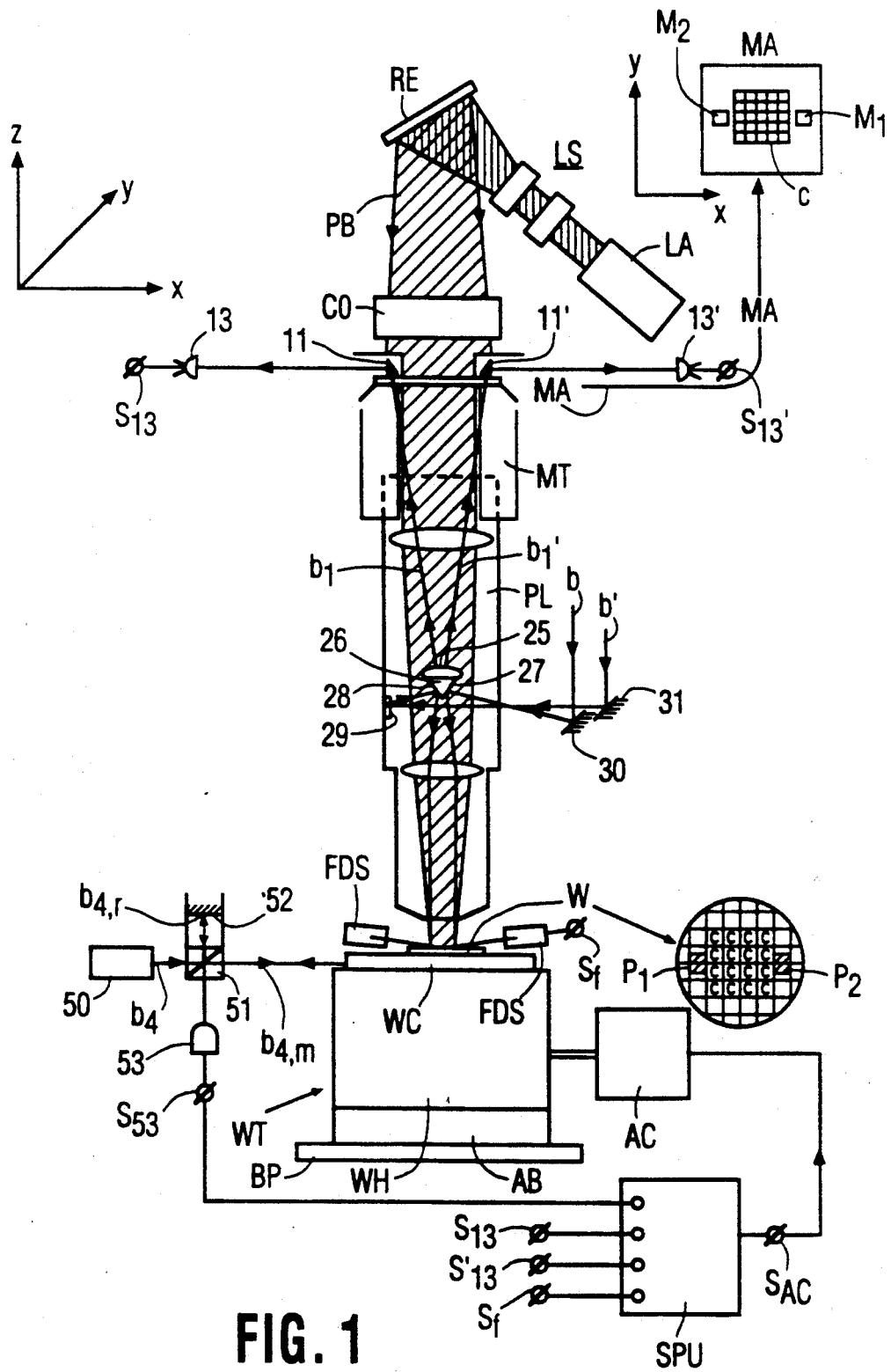
FIG. 1 shows an embodiment of an apparatus for repetitively imaging a mask pattern on a substrate, and including a focus detection device.

FIG. 1 shows the optical elements of an embodiment of an apparatus for repetitively imaging a mask pattern on a substrate. The main components of this apparatus are a projection column in which a mask pattern C to be imaged is provided and a movable substrate table WT with which the substrate can be positioned with respect to the mask pattern C. The apparatus further has an illumination system which comprises a radiation source LA, for example, a Krypton-Fluoride Excimer Laser, a lens system LS, a mirror RE and a condensor lens CO. The projection beam illuminates the mask pattern C which is present in the mask MA, which mask is arranged on a mask table MT.

The beam PB passing through the mask pattern C traverses a projection lens system PL arranged in the projection column and shown only diagrammatically, which system forms an image of the pattern C on the substrate W. The projection lens system has a magnification of, for example, $M = 1/5$, a numerical aperture $NA = 0.48$ and a diffraction-limited image field having a diameter of 21.2 mm. The substrate is held by a substrate support WC which forms part of a substrate table WT which is only shown diagrammatically.

The apparatus further comprises a plurality of measuring devices, namely a device for aligning the mask MA with respect to the substrate W in the XY plane, an interferometer system for determining the position and orientation of the substrate holder and hence of the substrate, and a focus error detection device for determining a deviation between the focal or image plane of the projection lens system PL and the surface of the substrate W. These measuring devices are parts of servo-systems which comprise electronic signal-processing and control circuits and drivers or actuators with which the position and orientation of the substrate and the focusing can be corrected with reference to the signals supplied by the measuring devices.

The alignment device uses two alignment marks $M_1$ and $M_2$ in the mask MA, indicated in the top right corner of FIG. 1. These marks preferably consist of diffraction gratings, but they may be alternatively formed by other marks such as squares or strips which are optically different from their surroundings. The alignment marks are preferably two-dimensional, i.e. they extend in two mutually perpendicular directions, the X and Y directions in FIG. 1. The substrate W, for example, a semiconductor substrate on which the pattern C must be imaged side by side several times, has a plurality of alignment marks, preferably also two-dimensional diffraction gratings, two of which, $P_1$ and $P_2$ are shown in FIG. 1. The marks $P_1$ and $P_2$ are located outside the areas on the substrate W where the images of the pattern C must be formed. The grating marks $P_1$ and $P_2$ are preferably phase gratings and the grating marks $M_1$ and $M_2$ are preferably amplitude gratings.

FIG. 1 shows a special embodiment of an alignment device, namely a double alignment device in which two alignment beams b and b' are used for aligning the substrate alignment mark $P_2$ on the mask alignment mark $M_2$, and the substrate alignment mark $P_1$ on the mask alignment mark $M_1$, respectively. The beam b is reflected by a reflecting element 30, for example, a mirror to the reflecting surface 27 of a prism 26. The surface 27 reflects the beam b to the substrate alignment mark $P_2$ which passes a part of the radiation as beam $b_1$ to the associated mask alignment mark $M_2$ where an image of the mark $P_2$ is formed. A reflecting element 11, for example, a prism is arranged above the mark $M_2$, which prism directs the radiation passed by the mark $M_2$ towards a radiation-sensitive detector 13.

The second alignment beam b' is reflected by a mirror 31 to a reflector 29 in the projection lens system PL. This reflector 29 passes the beam b'to a second reflecting surface 28 of the prism 26, which surface directs the beam b' onto the substrate alignment mark $P_1$. This mark reflects a part of the radiation of the beam b' as beam $b_1'$ to the mask alignment mark $M_1$ where an image of the mark $P_1$ is formed. The radiation of the beam $b_1'$ passing through the mark $M_1$ is directed towards a radiation-sensitive detector 13' by a reflector 11'.

The detectors 13 and 13' are, for example, composite photodiodes having, for example, four separate radiation-sensitive areas in conformity with the number of grating areas of the marks $P_1$, $P_2$, $M_1$ and $M_2$. The output signals of these detectors are a measure of the coincidence of the marks $M_2$ and $M_1$ with the image of the substrate marks $P_2$ and $P_1$, respectively. These signals can be processed electronically and used for moving the mask with respect to the substrate by means of driving systems (not shown) so that the image of the marks $P_2$ and $P_1$ coincides with the marks $M_2$ and $M_1$, respectively. An automatic alignment apparatus is thus obtained.

Reference is made to U.S. Pat. No. 4,778,275 for details about the alignment procedure by means of the alignment systems.

The embodiment of the alignment device according to FIG. 1, which is not described in U.S. Pat. No. 4,778,275, is particularly suitable for an apparatus in which an illumination beam having a short wavelength, for example, 248 nm and an alignment beam having a considerably longer wavelength, for example, 633 nm are used. This is due to the correction lens 25 which during alignment ensures that by the projection lens system, which is designed for the wavelength of the projection beam PB, the alignment marks $P_1$, $P_2$ and $M_1$, $M_2$ are imaged onto each other by the alignment beams without any focus errors or magnification errors.

For accurately determining the X and Y positions of the substrate table WT, known projection apparatuses comprise a multi-axis interferometer system. U.S. Pat. No. 4,251,160 describes a two-axis system and U.S. Pat. No. 4,737,283 describes a three-axis system. In FIG. 1 such an interferometer system is diagrammatically illustrated by means of the elements 50, 51, 52 and 53, the Figure showing only one measuring axis. A beam $b_4$ emitted by a radiation source 50 in the form of a laser is split into a measuring beam $b_{4,m}$ and a reference beam $b_{4,r}$ by a beam splitter 51. The measuring beam reaches a reflecting side face of the substrate support WC and the reflected measuring beam is combined by the beam splitter with the reference beam reflected by a stationary retroreflector 52, for example, a "corner cube". The intensity of the combined beam is measured with the aid of a detector 53 and the displacement, in this case in the X direction, of the substrate support WC can be derived from the output signal of this detector, and also an instantaneous position of this support can be established.

As is diagrammatically shown in FIG. 1, the interferometer signals represented by one signal $S_{53}$ for the sake of simplicity, and the signals $S_{13}$ and $S_{13}$, of the alignment detection device are applied to a signal processing unit SPU, for example, a microcomputer which processes said signals to control signals $S_{AC}$ for an actuator AC with which the substrate support is moved in the X-Y plane via the substrate holder WH.

By using an X-Y interferometer system the positions of and the mutual distances between the alignment marks $P_1$ and $P_2$ and $M_1$ and $M_2$ can be established in a system of coordinates defined by the stationary interferometer system during the alignment procedure.

An interferometer system with five measuring axes, as described in Netherlands Patent Application No. 9100215 is preferably used. With such a system it is not only possible to measure the X and Y positions and the rotation about the Z axis of the substrate, but also tilts of the substrate about the X and Y axes. This interferometer system may be extended with a reference measuring axis so as to be able to correct for refractive index variations in the medium in which the interferometer beams propagate.

The projection apparatus further comprises a focus error detection system FDS shown diagrammatically in FIG. 1 for determining a deviation between the image plane of the projection lens system PL and the surface of the substrate W so that this deviation can be corrected by moving the substrate with respect to the projection lens system along the Z axis. The output signal, or focus error signal $S_f$ of the system FDS is also applied to the signal processing unit SPU, so that one of the signals $S_{AC}$ is a control signal with which the distance between the lens system PL and the substrate W can be set via height actuators.

Figure 2:
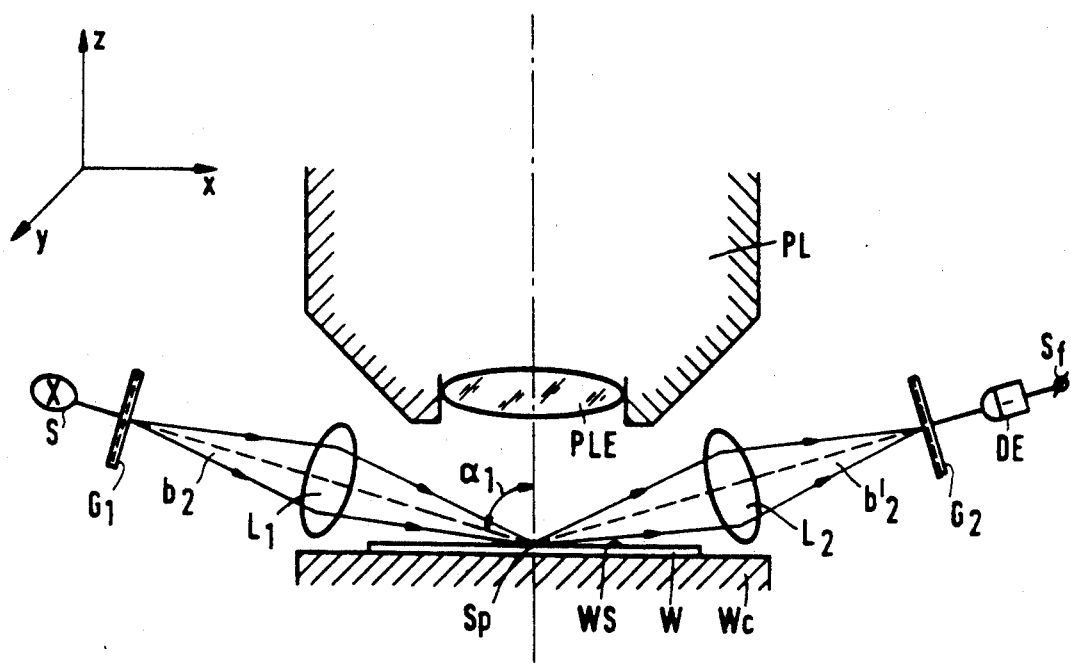
FIG. 2 shows diagrammatically a first embodiment of a focus detection device according to the invention, with gratings and wideband beams.

FIG. 2 shows diagrammatically a first embodiment of the focus detection system according to the invention, together with the lower part of the projection lens system PL. Only the last lens element PLE of this system is shown. The focus detection system comprises a radiation source S which supplies a focus detection beam $b_2$. This beam is focused by a lens system diagrammatically represented by means of the lens element $L_1$ in a radiation spot $S_p$ on the substrate W. The angle of incidence $\alpha_1$ of the beam $b_2$ on the substrate is relatively large, for example, of the order of 80°. The substrate reflects the beam $b_2$ and the reflected beam $b'_2$ is converted by a second lens system $L_2$ into a converging beam which is captured by a radiation-sensitive detector DE which supplies an electric signal $S_f$.

According to the invention, the beam $b_2$ has a relatively wide spectrum of wavelengths. It is thereby achieved that interferences which may be produced by multiple reflections on the different layers of the substrate are averaged out so that such interferences cannot influence the detector signal $S_f$. The wideband radiation source S is, for example, a halogen lamp, another incandescent lamp or a combination of a number of light-emitting diodes emitting different wavelengths. Such sources are, however, less intensive than the lasers hitherto used. Consequently, the focus error signal obtained would have a reduced signal-to-noise ratio. Moreover, the dimension of the smallest radiation spot which can be formed on the substrate is larger when using radiation having a wide spectrum as compared with the use of a laser beam. Consequently, the sensitivity of the focus detection device, i.e. the smallest focus error which can still be detected, which sensitivity is proportional to the size of the radiation spot, would decrease. To obtain the desired sensitivity and the required signal-to-noise ratio with the novel device, a grating is arranged, according to the invention, in the beam, which grating is imaged on the substrate surface WS. This grating whose grating lines extend, for example, in the Y direction, i.e. perpendicular to the plane of the drawing in FIG. 2, is denoted $G_1$. A second grating $G_2$ having the same grating period as that of the grating $G_1$ is arranged at the image side. The grating $G_1$ is imaged on the grating $G_2$ by means of the lens system $L_1$ via reflection on the substrate surface and by means of the lens system $L_2$. It has been ensured that the light and dark strips of the image of the grating $G_1$ exactly coincide with those of the grating $G_2$ if the substrate surface is located at the correct distance from the projection lens system PL. Then the detector DE receives a maximum quantity of radiation and the output signal of the detector is maximal. When moving the substrate surface with respect to the system PL into the Z direction, the dark strips of the imaged grating will more and more cover the light strips of the other grating and the detector signal will become increasingly smaller. Thus, the magnitude of the focus error can be derived from the detector signal.

In principle, the accuracy with which the focus error can be determined is now determined by the period of the grating. This period is, for example, 40 $\mu$m with which focus errors of the order of 0.1 $\mu$m can still be measured if interpolation techniques are used when processing the detector signal. Since a larger area of the substrate surface is used for the focus detection, local reflection differences or unevennesses of this surface will have a smaller influence on the focus error signal obtained.

A dynamic focus error signal is preferably generated, i.e. a periodically varying signal in which the focus error introduces a variation into one of the signal parameters such as the amplitude or the ratio between the period halves. Such a signal is independent of possible offsets in the electronic signal processing device and enables a more accurate detection. Moreover, the sign of a focus error can then be determined.

Figure 3:
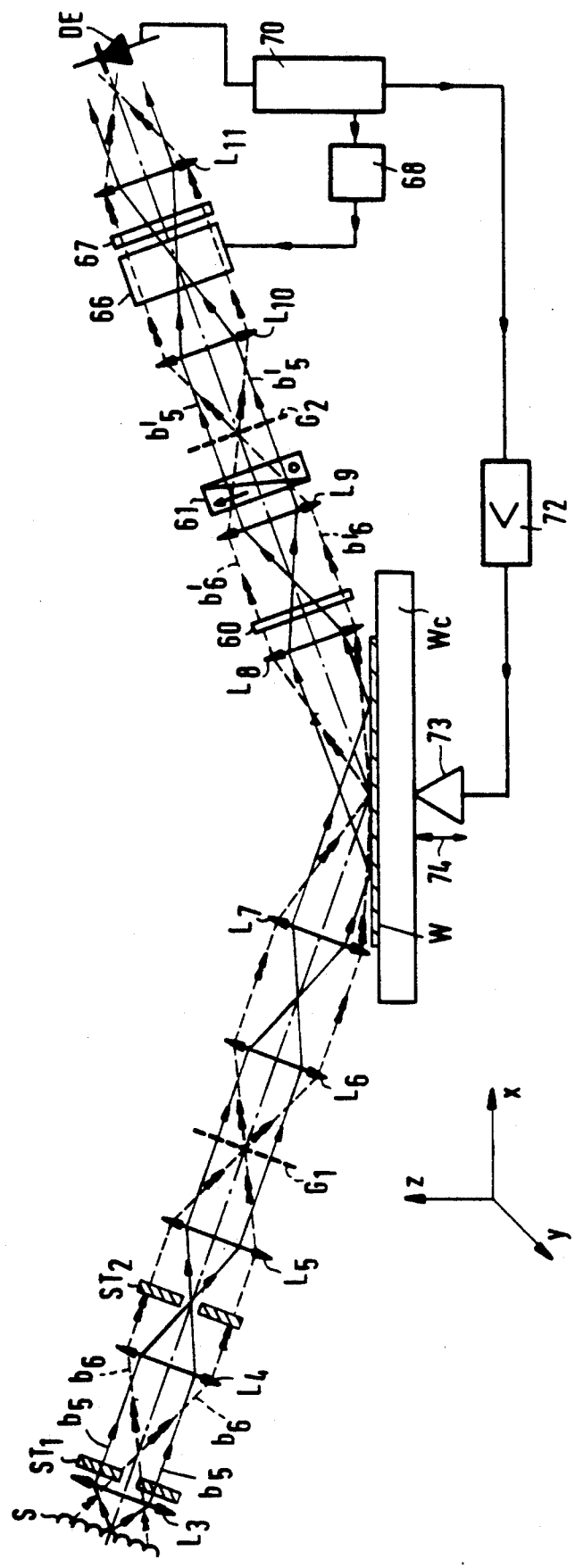
FIG. 3 shows this embodiment in greater detail, with means for generating a dynamic focus error signal.

A dynamic focus error signal can be generated by periodically displacing one of the elements in the radiation path of the focus detection beam. For example, the substrate itself can be moved periodically over small distances into the Z direction. However, for practical reasons it is preferred to use electro-optical means for generating a dynamic focus error signal. FIG. 3 shows an embodiment of the detection device provided with such means. This Figure also shows the optical system in greater detail.

This system comprises five lenses $L_3$–$L_7$ at the object side and four lenses $L_8$–$L_{11}$ at the image side. FIG. 3 shows two beams. The radiation source S is illustrated by means of the filament of a lamp. This lamp supplies a beam $b_5$ shown by means of solid lines and single arrows, which beam passes through the pupil $ST_2$ located between the lenses $L_4$ and $L_5$. This pupil is re-imaged between the lenses $L_6$ and $L_7$ and the beam $b_5$ is incident as a parallel beam on the substrate surface. The reflected beam $b'_5$ forms an image of the pupil between the lenses $L_8$ and $L_9$ and a second image between the lenses $L_{10}$ and $L_{11}$. At the area of the gratings $G_1$ and $G_2$ the beam $b_5$ and the beam $b'_5$, respectively, is a parallel beam.

The beam $b_6$ shown by means of broken lines and double arrows illustrates how the source S is imaged on the first grating $G_1$ and how this grating is imaged on the substrate. The Figure further shows how the reflected beam $b'_6$ forms an image of the first grating on the second grating and how this image and the grating $G_r$ are imaged on the detector DE.

Figure 4:
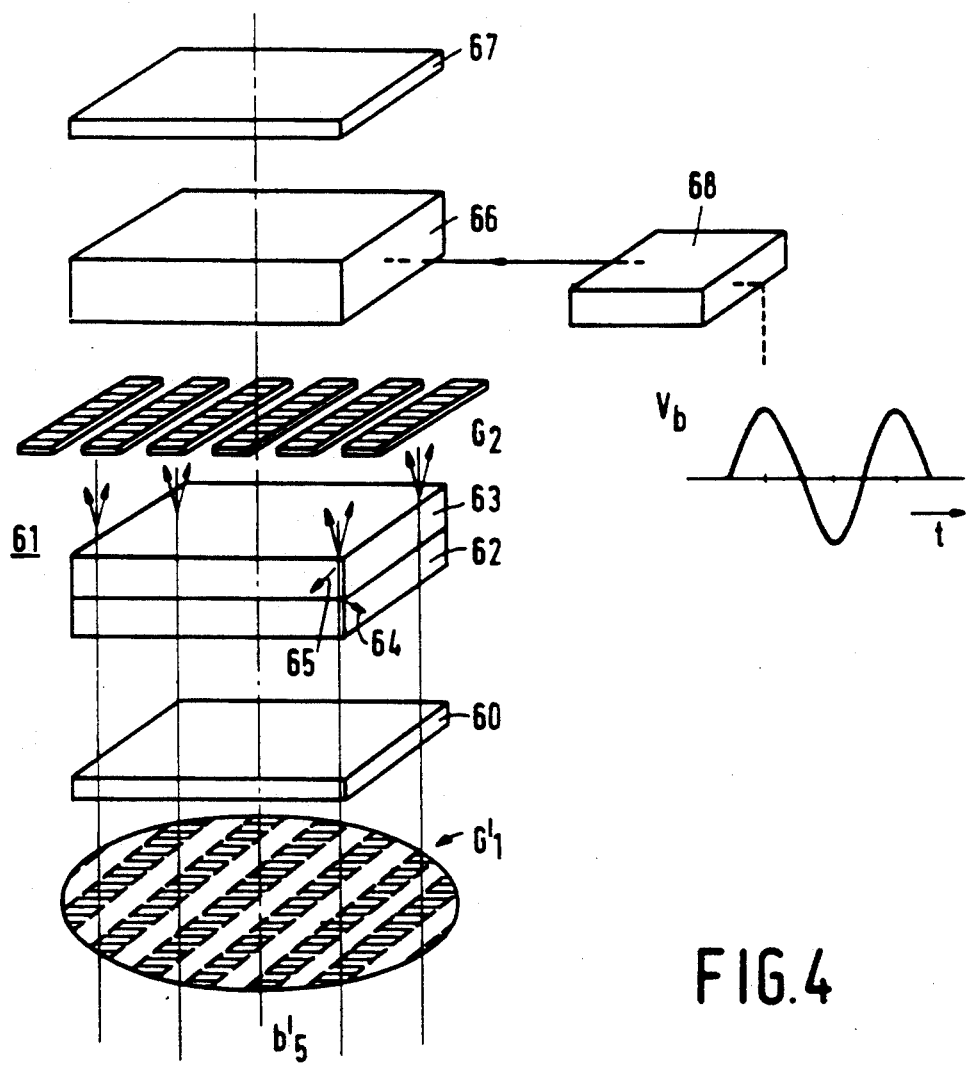
FIGS. 4, 5a, 5b, 6a and 6b show the principle of the system used in this embodiment for generating a dynamic focus error signal.

The means for generating a dynamic focus detection signal are constituted by a polarizer 60, a birefringent element 61, an electro-optical modulator 66 and an analyser 67. The operation of these means will be described in greater detail with reference to FIGS. 4, 5 and 6. FIG. 4 shows said elements in a perspective elevational view, as well as some rays of the oncoming beam $b'_5$ which is modulated by the grating structure $G_1$, as is indicated by means of broken lines. The birefringent element 61 may be a Savart plate. This plate is composed of two equally thick plane-parallel quartz plates 62 and 63 whose optical axes 64 and 65 extend at an angle of 45° to the plane-parallel planes and which are mutually crossed. The polarizer 60 ensures that of the oncoming beam $b'_5$ only the radiation having a direction of polarization at an angle of 45° to the optical axes of the Savart plate is passed towards this plate. The beam $b'_5$ perpendicularly incident on the plane-parallel planes of the Savart plate is split in the first quartz plate 62 into an ordinary beam and an extraordinary beam which are converted into an extraordinary beam and an ordinary beam, respectively, at the interface of the first and the second quartz plate. In fact, the optical axes of the two plates are perpendicular to each other. Two mutually perpendicularly polarized sub-beams which are shifted with respect to each other exit from the Savart plate 26, as is shown diagrammatically in FIG. 4.

A polarization modulator 66 and an analyzer 67 are arranged in front of the radiation-sensitive detector DE. The modulator is controlled by a voltage $V_b$ which is supplied by a generator 68. The direction of polarization of a radiation beam passing through the modulator is thereby switched in an alternating manner. The direction of passage of the analyzer is parallel to one of the directions of polarization of the ordinary and extraordinary beams from the Savart plate. As a result, either the ordinary or the extraordinary beam will be passed at any moment to the detector. This detector "sees" at a given moment either an ordinary image of the grating $G_1$ formed by the ordinary beam or an extraordinary image of this grating formed by the extraordinary beam, the ordinary and extraordinary image being superimposed with the grating $G_2$. The refractive indices of the Savart plate and the thicknesses of the composite plane-parallel plates have been chosen to be such that the ordinary and the extraordinary image are mutually shifted over half a period of the grating. If the grating $G_2$ is arranged exactly between the ordinary and the extraordinary image of the grating $G_1$, the intensity of the radiation captured by the detector DE will be constant with respect to time.

Figure 5A:
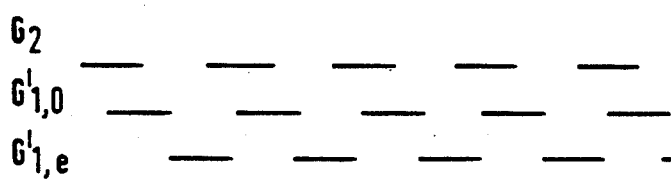
Figure 5B:
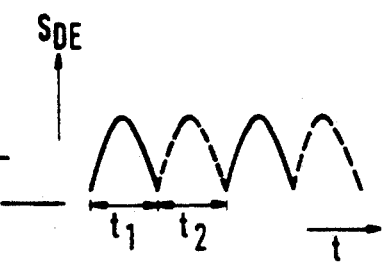

FIG. 5a shows this situation. The strips of the grating $G_2$ of the ordinary image $G'_{1,o}$ and of the extraordinary image $G'_{1,e}$ of the grating $G_1$ are perpendicular to the plane of the drawing. During a time interval $t_1$ the detector receives the radiation intensity passed by $G'_{1,o}$ and $G_2$ (cf. FIG. 5b) and during a subsequent time interval $t_2$ it receives the radiation intensity passed by $G'_{1,e}$ and $G_2$. These intensities are equal so that the detector signal $S_d$ remains constant with respect to time.

Figure 6A:
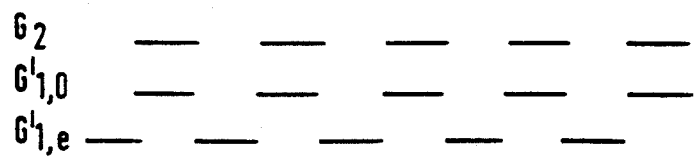
Figure 6B:
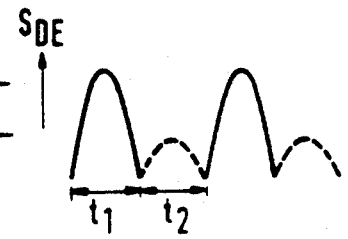

If the grating $G_2$ is not located exactly between $G'_{1,o}$ and $G'_{1,e}$, cf. FIG. 6a, the detector signal is not constant with respect to time, as is shown in FIG. 6b. The differences in the signal $S_d$ can be detected very accurately. This makes it possible to measure the displacement of the grating image $G'_1$ with respect to the grating $G_2$, which displacement is caused by a focus error, very accurately. If use is made of interpolation techniques in signal processing, focus errors of the order of 1/200 of the grating period can still be measured.

In the case of FIG. 6b, in which the grating image $G'_1$ is moved to the left with respect to the grating $G_2$, the detector signal in the time interval $t_1$ is larger than the detector signal in the time interval $t_2$. If the grating image $G'_1$ is moved to the right with respect to the grating $G_2$, the detector signal in the time interval $t_1$ will be smaller than in the time interval $t_2$.

As shown in FIG. 3, the signal of the detector DE is applied to the electronic processing circuit 70. The signal of the generator 68 is also applied to the circuit 70. By comparing in which time interval $t_1$ and $t_2$ the detector signal is largest, the direction of a possible focus error can be detected. The focus error signal obtained is applied via a high-voltage amplifier to an actuator 73, for example, one or more piezoelectric elements which displace the substrate support and hence the substrate over the desired distance and into the desired direction along the Z axis so that a focus error no longer occurs.

Instead of a Savart plate it is also possible to use a Wollaston prism as is denoted by 61 in FIG. 3. Such a prism comprises two congruent sub-prisms of single-axis birefringent crystals which are formed to one plane-parallel plate. The optical axes of the sub-prisms are mutually perpendicular. A radiation beam incident on one of the plane-parallel large faces of the prism 61 is split in the prism into two sub-beams having mutually perpendicular directions of polarization. By suitable choice of the parameters of the prism 61 it can be ensured that the images, formed by the sub-beams, of the grating $G_1$ at the location of the grating $G_2$ are shifted over half a grating period.

Figure 7:
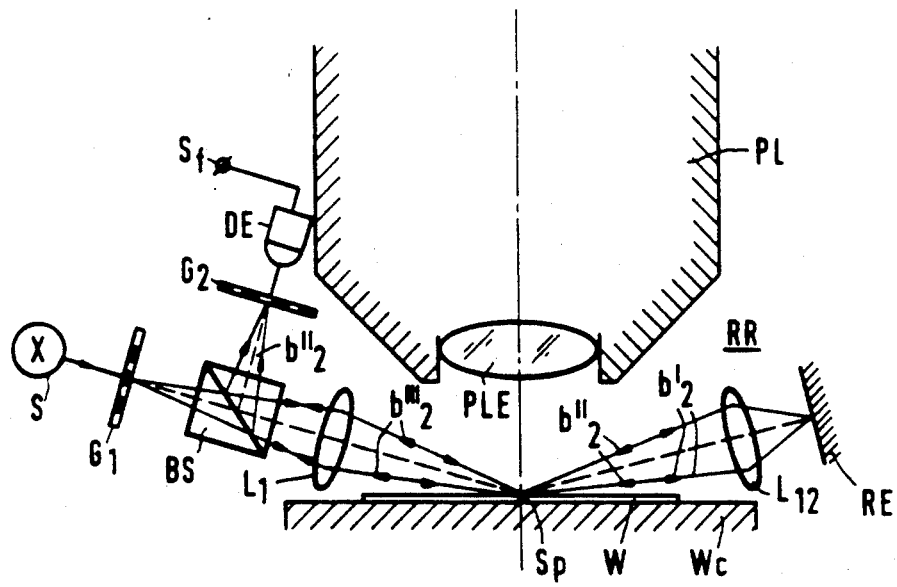
FIG. 7 shows an embodiment of the focus detection device with gratings in which a retroreflector is used.

FIG. 7 shows an embodiment of the focus detection device in which a retroreflector RR is arranged in the path of the focus detection beam reflected once by the substrate surface. This reflector may be a hollow mirror, a corner cube prism or, as is shown in FIG. 7, a combination of a lens $L_{12}$ and a reflector RE in the focal plane of this lens. This retroreflector reflects the beam along itself, i.e. the principal axis of the beam incident on the reflector coincides with that of the reflected beam $b_2''$. The beam halves of the beams are then interchanged. As described in U.S. Pat. No. 4,356,392, this has the advantage that local reflection differences of the substrate cannot influence the intensity distribution within the radiation spot which is ultimately formed on the detector DE. The beam $b_2'''$ which is reflected a second time by the substrate surface is coupled out to the second grating $G_2$ and the detector DE arranged behind it by a beam-separating element BS. Due to the double reflection on the substrate surface the sensitivity of the focus detection device is increased by a factor of two. Also in the embodiment of FIG. 7 a dynamic focus error signal can be generated in the ways as described with reference to FIG. 3. This also applies to the embodiments to be described hereinafter.

In the embodiments of FIGS. 2, 3 and 7 focus errors are measured in an indirect way, i.e. only the Z position of the substrate is measured, assuming that the substrate is the only moving element so that also the distance between the substrate and the projection lens system is known. To achieve the required stability in the focus detection device and the stability of this device with respect to the projection lens system to a certain extent, the optical elements in the radiation path of the focus detection beam, from the radiation source to the detector, may be fixed in a holder, analogously as described in U.S. Pat. No. 4,356,392, or in a mounting plate, which holder or plate is connected to the projection lens system. Notably if smaller details must be imaged and if the focusing must thus be detected and adjusted more accurately, the extent of stability to be achieved may be too small. The remaining instabilities are caused by remaining clearances of the optical elements in their fittings and of these fittings in the holder or mounting plate and by clearance in the connection of the holder or mounting plate to the holder of the projection lens system.

In accordance with a second aspect of the present invention the above-mentioned problem can be prevented by making use of a reference beam which is directed onto a plane at the lower side of the projection lens system which is parallel to the substrate, for example, the outer surface of a transparent reference plate which is especially arranged in the projection lens system for reflecting the reference beam. Said plane reflects the reference beam towards a second detector. The actual distance between the substrate and the projection lens system can then be measured from the difference of the signals of this second detector and of the first detector receiving the focus detection beam. The use of the reference beam is not limited to the embodiments with gratings in the focus detection beam. The use of the reference beam may also yield considerable advantages in more conventional focus detection devices without gratings.

Figure 8:
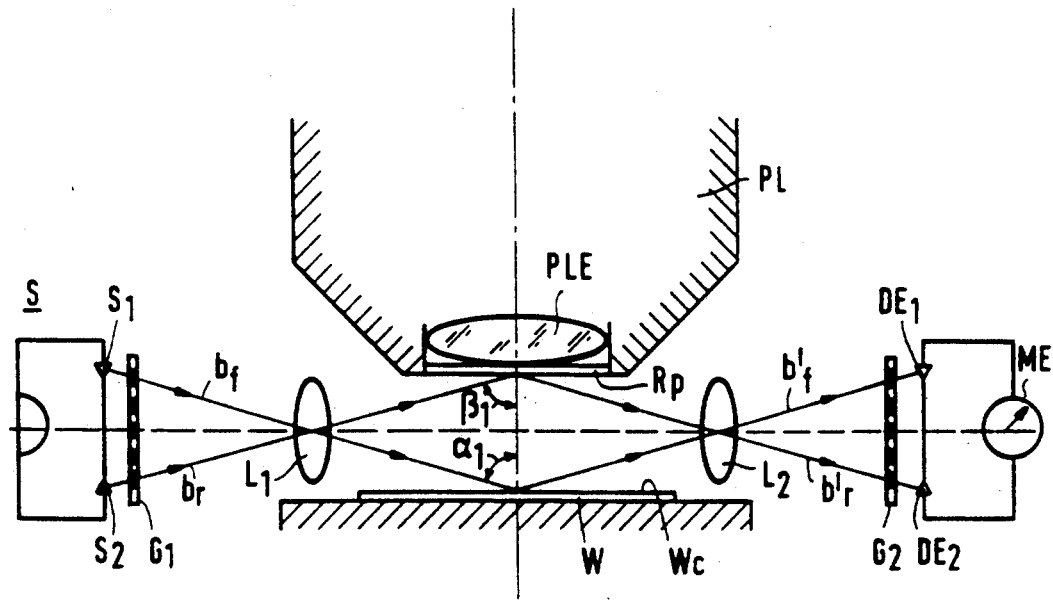
FIGS. 8, 9, 9a, 10, 11, 12, 13 and 14 show embodiments of the focus detection device with a reference beam and including or not including gratings and reflectors.

FIG. 8 shows a first embodiment of a focus detection device with a reference beam $b_r$. A reference plate RP is now arranged underneath the last lens element PLE of the projection lens system. The reference beam grazes this plate, i.e. the angle of incidence $\beta_1$ is large, for example, equally large as the angle of incidence $\alpha_1$ on the substrate W. The reference beam is reflected by the plate RP and the reflected beam $b'_r$ is captured by a detector $DE_2$, for example, a photodiode. A second photodiode $DE_1$ which captures the focus detection beam $b'_f$ reflected by the substrate may be arranged in series with this photodiode. As is denoted symbolically by means of the meter ME, the difference of the output signals of the photodiodes is measured. This difference signal is a measure of the distance between the plate RP and the substrate W. Actually, the difference signal is compared with a reference signal in an electronic signal processing circuit and a control signal is generated for an actuator with which, for example, the substrate is moved into the Z direction. The radiation source S comprises two radiation-emitting elements, for example, LEDs $S_1$ and $S_2$.

A first grating is preferably arranged at the object side and a second grating is preferably arranged at the image side in the radiation path of both the focus detection beam and the reference beam, which gratings are imaged onto each other by means of the lens systems $L_1$ and $L_2$ and reflections on the substrate and the reference plate, respectively. The radiation passed by the gratings at the image side is captured by the detectors $DE_1$ and $DE_2$. The gratings in the focus detection beam and the reference beam may be separate elements, similarly as the elements of the lens systems $L_1$ and $L_2$. However, the grating $G_1$ at the object side and the grating $G_2$ at the image side and the lens systems are preferably common for the two beams.

In the embodiment of FIG. 8 it is also possible to generate a dynamic focus error signal by arranging a polarizer and a birefringent element in front of the grating $G_2$ and a polarization modulator behind this grating, as is described with reference to FIGS. 3, 4, 5 and 6.

Figure 9:
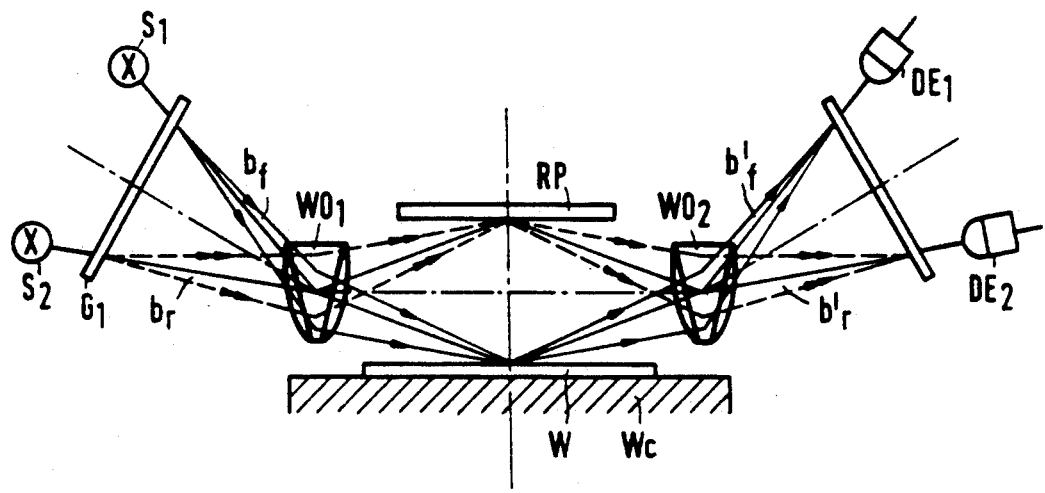

FIG. 9 shows diagrammatically an embodiment of the focus detection device which is compact because of the use of special optical systems which are represented, for the sake of simplicity, by single wedge-shaped elements $WO_1$ and $WO_2$ on which lens elements are arranged. The system $WO_1$ deflects the focus detection beam $b_f$ and the reference beam $b_r$ in such a way that these beams graze the substrate and the reference plate, respectively and also converts the diverging beams into converging beams. The optical system $WO_2$ converts the diverging reflected beams $b'_f$ and $b'_r$ into converging beams and deflects these beams towards the detector $DE_1$ and the detector $DE_2$, respectively. The device of FIG. 9 may be formed with or without gratings $G_1, G_2$.

Figure 9A:
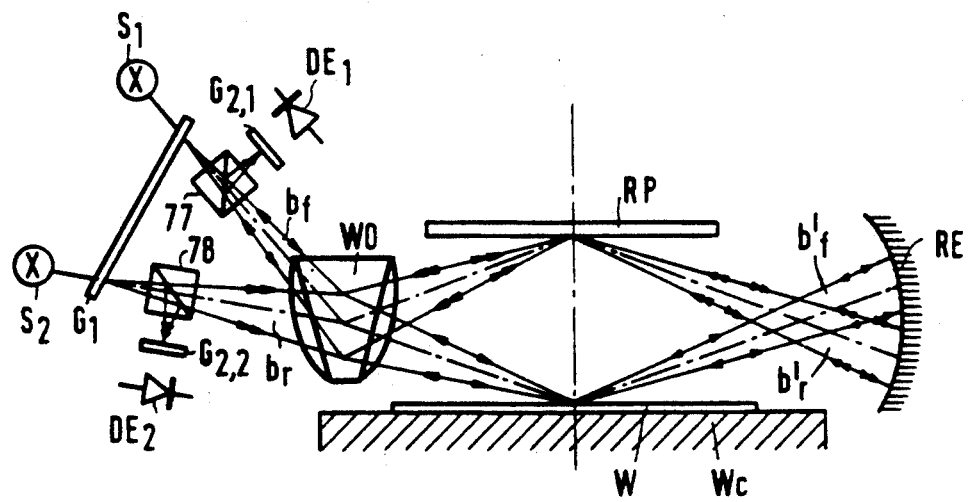

The embodiment of FIG. 9a is based on the principle of that of FIG. 9. Now only one special optical system WO with a wedge and lenses is used. A retroreflector RE, for example, in the form of a hollow mirror is arranged in the paths of the focus detection beam $b'_f$ and the reference beam $b'_r$ reflected by the substrate W and the reference plate RP, respectively. This mirror reflects the beams along themselves so that they are reflected a second time by the substrate and the reference plate, respectively. The focus detection beam is incident on a beam separator 77 which reflects the beam towards a first detection grating $G_{2,1}$ and a detector $DE_1$ arranged behind it. The reference beam is incident on a beam separator 78 which reflects the beam towards a second detection grating $G_{2,2}$ and a detector $DE_2$ arranged behind it.

Figure 10:
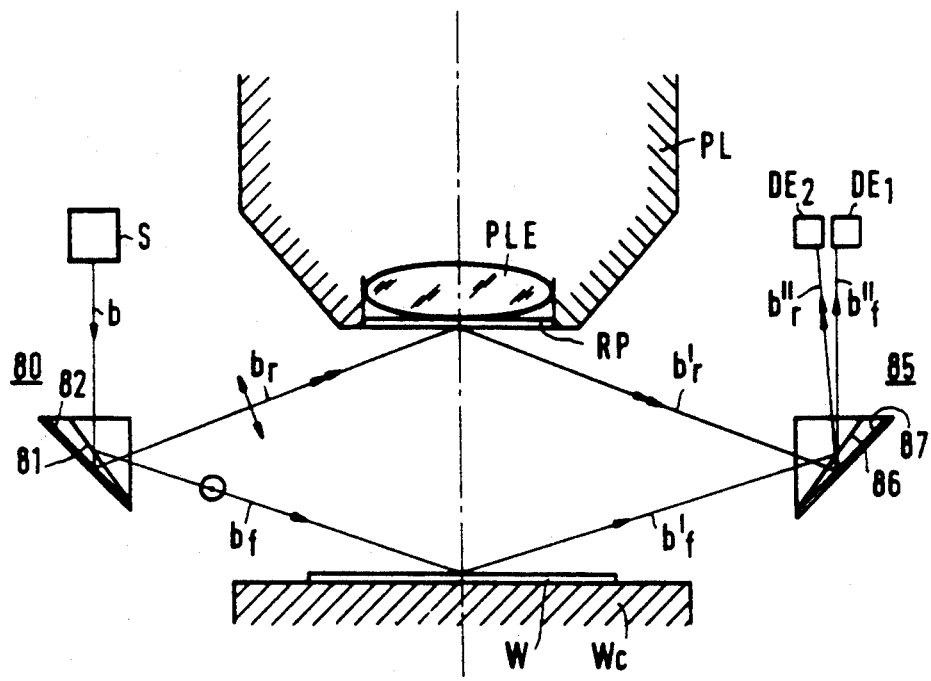
Figure 11:
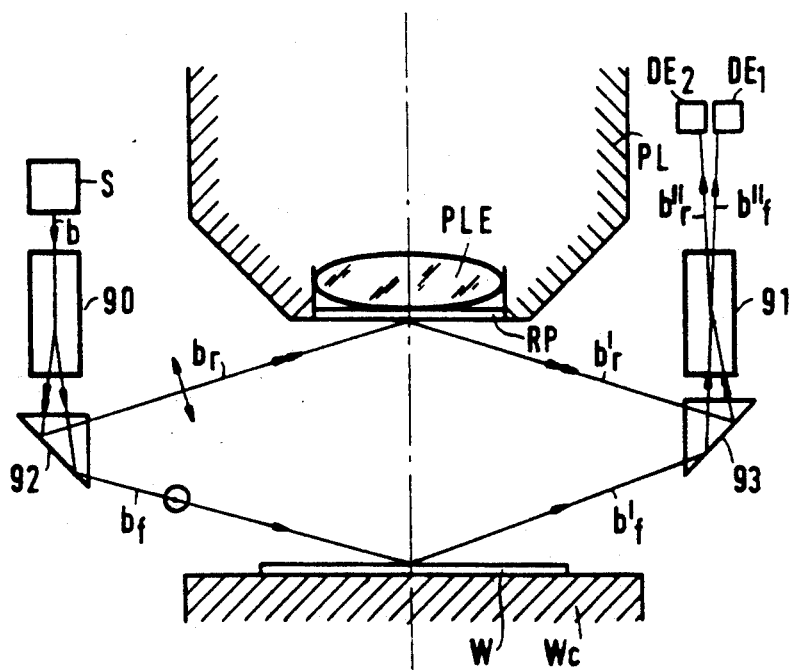

FIGS. 10 and 11 show embodiments of the focus detection device in which use is made of beams having different directions of polarization. In FIG. 10 the reference numeral 80 denotes a composite prism having a polarization-sensitive interface 81. This face reflects a beam component having a first direction of polarization, for example, perpendicularly to the plane of the drawing, as a focus detection beam towards the substrate W. The second beam component, whose direction of polarization is parallel to the plane of the drawing, is passed by the interface 81 and subsequently reflected as reference beam $b_r$ by the rear face 82 of the prism towards the reference plate RP of the projection lens system PL. Since the beam $b_r$ is incident at a different angle on the interface 81, this beam is passed. A second composite prism 85 which is analogous to prism 80 is arranged in the path of the reflected beams $b'_f$ and $b'_r$. The polarization-sensitive face 86 of the prism 85 reflects the beam $b'_f$ as beam $b''_f$ towards the detector $DE_1$, while the rear face 87 of this prism reflects the beam $b'_r$ as beam $b''_r$ towards the detector $DE_2$. The geometry of the prism 85 is slightly different from that of the prism 80 so that the beams $b''_f$ and $b''_r$ are spatially separated.

In the embodiment of FIG. 11 a composite birefringent element 90, such as a Wollaston prism or a Rochon prism is used for spatially separating the mutually perpendicularly polarized components of the beam b. These beam components are reflected as beams $b_f$ and $b_r$ by a prism 92 towards the substrate W and the reference plate. A prism 93 analogous to the prism 92 and a birefringent element 91 analogous to the element 90 are arranged in the path of the reflected beams $b'_f$ and $b'_r$. Here again the elements differ to such an extent that the beams $b''_f$ and $b''_r$ leaving the element 91 are spatially separated.

The devices according to FIGS. 10 and 11 may also comprise a wideband radiation source and gratings and may also be provided with means for generating a dynamic focus error signal.

Figure 12:
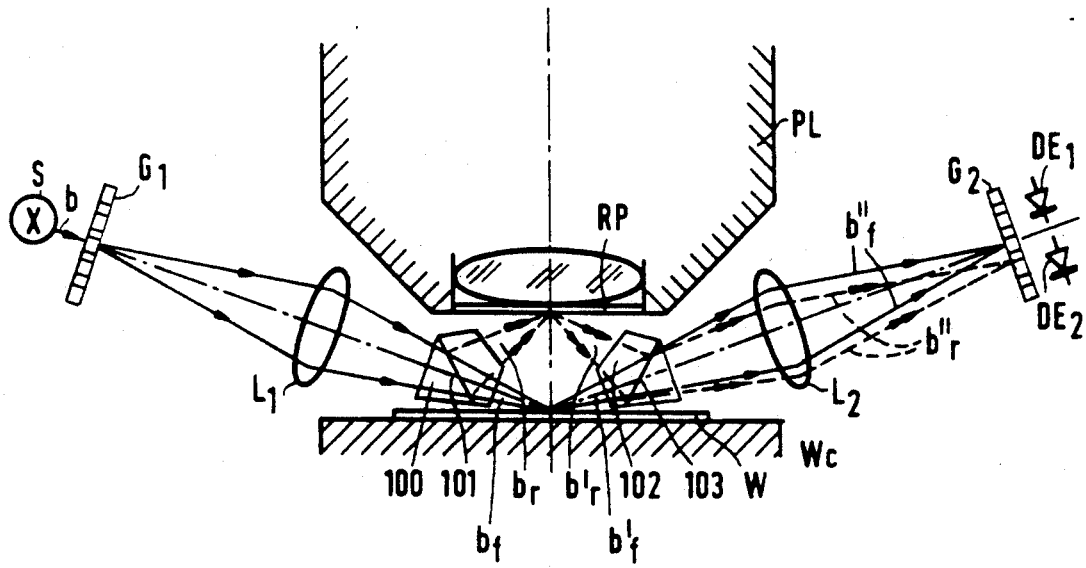

FIG. 12 shows a further alternative of the embodiment in which differently polarized beams are used as focus error detection beams and reference beams. A composite prism 100 comprising two sub-prisms of birefringent material separated by an interface 101 are arranged in the path of the beam emitted by the source S. The beam component having a first direction of polarization passes the interface 101 unhindered and is obliquely incident on the substrate W as focus detection beam $b_f$. The beam component having the second direction of polarization is deflected at the interface 101 between the first sub-prism and the second sub-prism and is obliquely incident on the reference plate of the projection lens system as reference beam $b_r$. After reflection by the substrate and the reference plate, the beams $b'_f$ and $b'_r$ are combined by a second composite prism 102 also comprising two birefringent sub-prisms and an interface 103 which operates in a way reverse to that of prism 100. The prism 102 has a slightly different geometry than the prism 100 so that the beams $b''_f$ and $b''_r$ are spatially separated to a sufficient extent to be incident on the separate detectors $DE_1$ and $DE_2$. The use of a wideband source S and gratings $G_1$ and $G_2$ is optional again, similarly as the generation of a dynamic focus error signal.

The concept of a focus detection device with a focus detection beam and a reference beam may also be realized with a single beam instead of with two separate beams, which single beam is successively reflected on the substrate and on the reference plate. Embodiments are shown in FIGS. 13 and 14.

Figure 13:
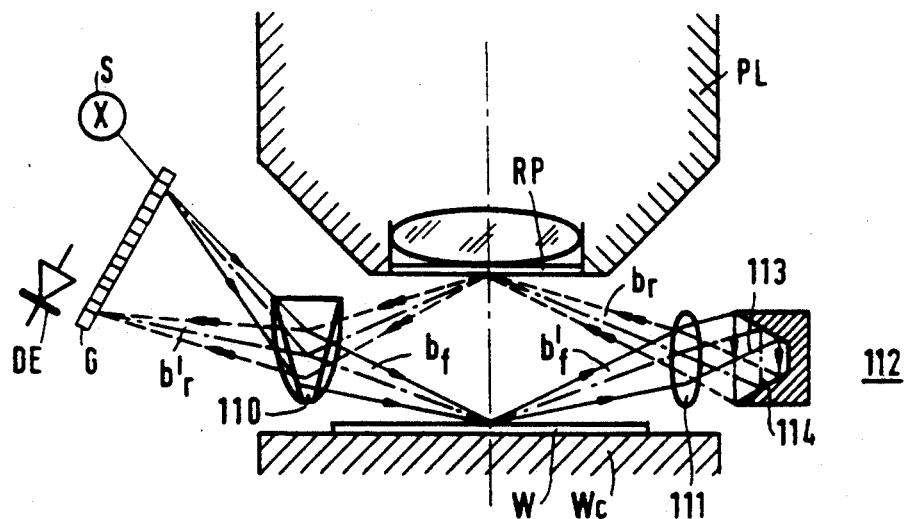

In the device of FIG. 13 the beam $b_f$ from the source S is converged by an optical system 110 illustrated by means of an optical wedge and lenses and is deflected in such a way that it grazes the substrate W. The reflected beam $b'_f$ reaches a reflector 112 and is reflected successively by the interfaces 113 and 114. This beam now functions as the reference beam $b_r$ which grazes the reference plate of the projection lens system PL. The reflected reference beam is deflected towards and converged on the detector DE by the optical system 110. If the distance between the reference plate and the substrate is correct, the optical path covered by the beam with which the source is imaged on the detector is such that this image is correctly positioned with respect to the detector DE. When changing the distance between the plate RP and the substrate, said optical path length changes and said image is shifted with respect to the detector.

Figure 14:
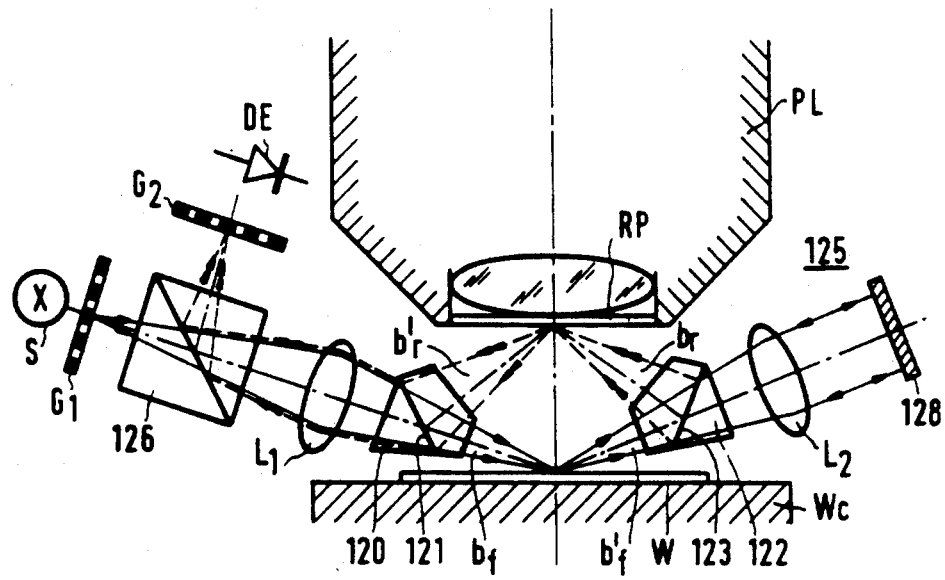

In the embodiment of FIG. 14 use is made of a prism 120 which comprises two sub-prisms of different birefringent material. The beam $b_f$ emitted by the source S has such a direction of polarization and is incident on the interface 121 at such an angle that this beam is passed towards the substrate W. A second prism 122 analogous to the prism 120 is arranged in the path of the reflected beam $b'_f$, which prism passes this beam towards a retroreflector 125, for example, comprising a lens 127 and a mirror 128 in its focal plane. The beam is now reflected along itself and is incident on the second prism in a direction opposite to that at the first passage. Then the beam is deflected towards the reference plate RP and functions as reference beam $b_r$. The beam $b'_r$ reflected by the plate RP is then deflected by the prism 120 in such a way that it coincides with the original beam $b_f$. A beam-separating element 126 which couples a part of the beam $b'_r$ towards the detector DE is arranged in the path of the coincident beams.

In the embodiments gratings $G_1$ and $G_2$ can again be used in combination with a beam having a large wavelength band. Then the elements 110 and 112 of FIG. 13 and the elements $L_1$, 120, 122 and $L_2$ of FIG. 14 must be satisfactorily corrected for the different wavelengths. A dynamic focus error can then again be generated in the way as described with reference to FIGS. 3, 4 and 5.

For each field of the substrate on which a mask pattern must be projected a focus error can be measured at one point of this field with the aid of the devices described so far. The substrate as a whole may be wedge-shaped or may be arranged obliquely, or the substrate may have local unevennesses so that points of the field outside the point where the focus error is measured may remain defocused, resulting in an inaccurate image at these points. In an apparatus for repetitively imaging a mask pattern on a substrate it is therefore desirable to be able to determine the local tilt, or tilt per field and to correct this tilt, for example, by means of a number of height actuators for the substrate.

Figure 15:
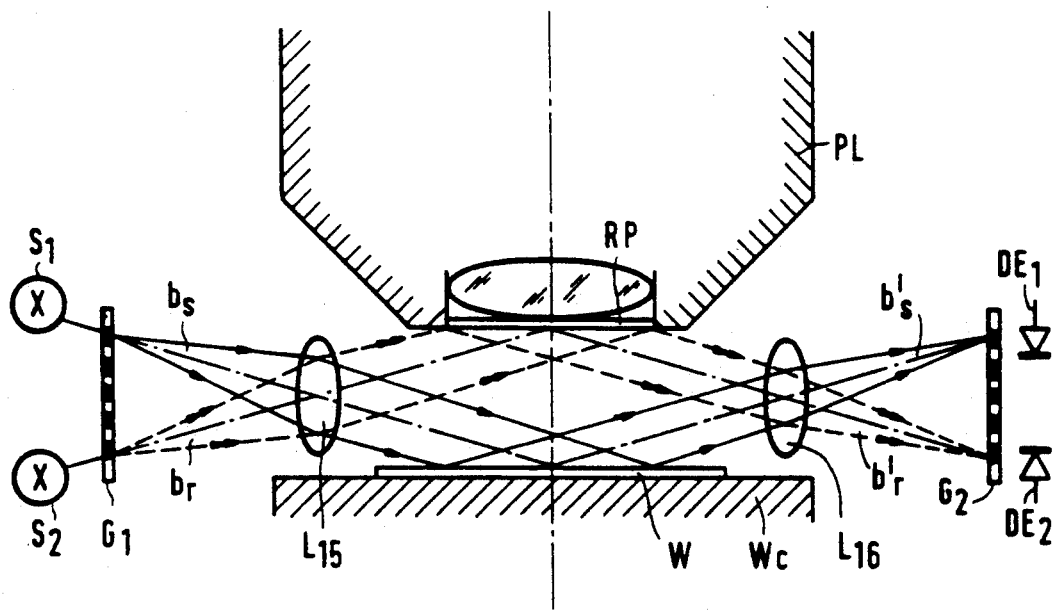
FIG. 15 shows the principle of a tilt detection device making use of a grating-onto-grating image.

The grating concept can be used for realizing the tilt. Its principle is shown in FIG. 15. The diverging beam $b_s$ supplied by the radiation source $S_1$ and passing through the grating $G_1$ is converted into a parallel beam by a lens system $L_{15}$. This beam is reflected by the substrate W and subsequently converged by a second lens system $L_{16}$. The lens system $L_{15}$ and $L_{16}$ jointly form an image of the grating $G_1$ on the grating $G_2$. It has been ensured that in the case of a horizontal substrate surface the grating lines of the imaged grating coincide with those of the grating $G_2$. Since the beam incident on the substrate W is a parallel beam, the reflected beam $b'_s$ will acquire a different direction when the substrate is tilted, so that the image of $G_1$ shifts with respect to $G_2$ and the detector receives more, or less radiation.

As is shown in FIG. 15, use is preferably made of a reference beam $b_r$. With this beam a grating $G_1$ is imaged on a grating $G_2$ via reflection on the reference plate RP, whereafter the beam RP is incident on a second detector $DE_2$. The position of the image of the grating $G_1$ on the grating $G_2$, and hence the output signal of the detector $DE_2$ is determined by the position of the reference plate RP. The tilt of this plate can thus also be measured.

It is to be noted that there may be modifications of the embodiment of FIG. 15. For example, the two separate radiation sources may be replaced by one radiation source in combination with beam-splitting means.

A local tilt detection can be performed by performing a focus error measurement at three points of the field, as is diagrammatically shown in FIG. 16a. This Figure shows a substrate W with a substrate field $W_v$ in which the points where the focus detection is performed are denoted by a, b and c. For each focus measurement a separate focus detection device can be used in one of the above-described embodiments. By comparing the focus measuring signals $S_{fa}$ and $S_{fb}$ of the points a and b, the tilt $\theta_x$ about the X axis can be determined and by comparing the focus measuring signal $S_{fc}$ of the point c with $S_{fa}$ and/or $S_{fb}$, the tilt $\theta_y$ about the Y axis can be determined. The signals of the three measuring points, and possible further measuring points can also be combined in a different way and the measuring points may also have a different mutual positioning.

According to the invention, two focus detection devices in accordance with the principles described above can be used for measuring the local tilt, which devices supply two focus detection beams each. With these beams it is possible to measure at a large number of points, namely four points, while the tilt detection device is not too complex. FIG. 16b shows the location of the measuring points a, b, c and d in the substrate field $W_v$. The squares $S_{p1}$, $S_{p2}$, $S_{p3}$ and $S_{p4}$ are the radiation spots formed by the four focus detection beams. These spots have a surface area of, for example, $2\times 2$ mm$^2$. The radiation spots are located close to the edges of the substrate field so as to measure the tilt as accurately as possible. The angles $\gamma_1$ and $\gamma_2$ are, for example, 20° and 25°.

If the focus detection devices operate with wideband beams and gratings, the radiation spots $S_{p1}$, $S_{p2}$, $S_{p3}$ and $S_{p4}$ are larger than is shown in FIGS. 16a and 16b. When a wideband less intensive radiation source is used, the beam cross-section and hence the exposed substrate surface must be larger so as to obtain sufficient radiation energy on the detector so that the device has a sufficient sensitivity. Because of this sensitivity, gratings are also used. To reduce the risk of reflection effects, the gratings should have a large number of grating lines, which means that the radiation spot on the substrate must be large.

FIG. 17 shows the principle of the tilt detection device comprising two double focus detection devices. The chief rays $h_1$ and $h_2$ of the first focus detection device are denoted by means of solid lines and the chief rays $h_3$, $h_4$ of the second focus detection device are denoted by broken lines. The reference symbols a, b, c and d are the points where these chief rays are incident on the substrate W. The Figure only shows a small part of this substrate. The elements which ensure that the focus detection beams graze the substrate are represented by the mirrors $M_1$ and $M_2$ for the sake of simplicity. Each double focus detection device is divided into three blocks: an illumination block $B_1$, an imaging block $B_2$ and a detection block $B_3$, which blocks will be described with reference to the following embodiment. Although this has not been shown for the sake of simplicity in FIG. 17, the tilt detection device comprises gratings and/or reference beams which are reflected on the reference plate of the projection lens system, as will be described hereinafter.

An embodiment of the tilt detection device diagrammatically shown in FIG. 17 is shown in FIGS. 18, 19 and 20, which Figures show, in this order, the blocks $B_1$, $B_2$ and $B_3$ which are actually arranged one after the other. The Figures indexed a are vertical cross-sections and those indexed b are horizontal cross-sections.

In FIGS. 18a and 18b the reference numeral 130 denotes the radiation source, preferably the filament of a halogen lamp, which emits a continuous spectrum in the wavelength range of 725 nm to 1050 nm. The filament has dimensions of, for example, $3.6 \times 1.8$ mm$^2$. The beam b emitted by the lamp is captured by a condenser lens 131 which is, for example, an aspherical lens, and is converted into a parallel beam. Subsequently, the beam is converged by a second condenser lens 133 which is, for example, an aspherical lens. The lenses 131 and 133 combined form an image of the filament.

A blue filter may be arranged between the lenses 131 and 133 to prevent blue radiation emitted by the halogen lamp from reaching the substrate and to prevent such radiation from reaching other measuring systems of the projection apparatus, which systems operate with this short-wave radiation.

An optical fiber 134 is preferably used. The lamp can then be placed at a larger distance, for example, 1.5 m from the detection device so that this device cannot be heated by the thermal radiation of the lamp. Moreover, the fiber can adapt the width-height ratio of the filament to the grating dimensions. The entrance plane of the fiber 134 coincides with the filament image formed by the lens system 131, 133. In view of the requirements to be imposed further down the system, the fiber has a relatively small numerical aperture, for example, 0.22.

The fiber branches out in two fibre ends 135, 136, the first end supplying an illumination beam $b_{i,m}$ and the second end supplying an illumination beam $b_{i,r}$ intended to illuminate a measuring grating 157 and a reference grating 158, respectively. These gratings are arranged on the flat rear side of a transparent supporting plate 150. To image the exit plane of the fiber 135 on the grating 157, a lens system which is, for example, telecentric and which comprises a condenser lens 137 and a plano-convex lens 139 is used. To obtain a uniform illumination of the grating 157, the image of the fiber exit plane is formed slightly outside the plane of the grating. The exit plane of the fiber 136 is imaged on the grating 158 by means of a lens system 138, 140 which is identical to the system 137, 139.

In connection with the available space it may be necessary to deflect the optical axis of the illumination system, ensuring that the axis is perpendicular to the plane of the gratings. This deflection can be realized by means of the mirror 160 shown diagrammatically.

In the vertical plane the illumination beam $b_{i,m}$ must extend at a small angle of, for example, $-6.5°$ to the optical axis, whilek the illumination beam $b_{i,r}$ must extend at an opposite angle of, for example, $+6.5°$ to this axis. To this end, the front side of plate 150 has two oblique ends 152 and 153, making the plate ends wedge-shaped and deflecting the beams at the right angle. In the horizontal plane the illumination beams $b_{i,m}$ and $b_{i,r}$ are parallel to the optical axis.

FIGS. 19a and 19b show how the gratings 157 and 158 are imaged on the substrate W and the reference plate of the projection lens system, respectively, by means of a telecentric system 170. This system, which is diagrammatically represented by the lens elements 171, 172, does not only form the grating images by means of the focus detection beam $b_f$ and the reference beam $b_r$ but also deflects this beam with respect to the optical axis at angles which are equally large but opposite to the angles at which the wedge-shaped ends of the grating plate 150 deflect. The beams reflected by the substrate W and the reference plate RP traverse a second telecentric system 175 which is analogous to the system 170. The system 175 ensures a re-image of the image of the measuring grating and the reference grating formed on the substrate and the reference plate, respectively. These re-images are formed on a detection measuring grating 187 and a detection reference grating 188. These gratings are arranged on the flat front side 186 of a transparent support 180 and, in case of a 1-to-1 image, they have the same geometry as the gratings 157 and 158. The grating plate 180 has the same shape as the plate 150 but is rotated through 180° about an axis in the plane of the drawing and perpendicular to the optical axis so that the wedges deflect the beams away from the optical axis.

If necessary in view of the available space, a first and a second mirror 190 and 191 may be arranged in the path of the focus detection beam $b_f$ for deflecting the beams towards the substrate and the reference plate and a third and a fourth mirror 192 and 193 for redeflecting the beams from the substrate and the reference plate.

A birefringent plate 200 of, for example, quartz is arranged in front of the grating plate 180, which plate 200 ensures that "ordinary" and "extraordinary" images of the gratings 157 and 158 are formed on the gratings 187 and 188, as has been explained with reference to FIGS. 3 and 4, in which the extraordinary images are shifted over half a grating period with respect to the gratings 187 and 188. As has been shown in FIGS. 3 and 4, the birefringent plate must be preceded by a polarizer. This polarizer may be formed by means of a polarization foil provided between two plane-parallel plates which jointly form one plate 205. The plates 200 and 205 must be perpendicular to the beams $b'_f$ and $b'_r$ so that each plate is divided into two parts 201 and 202 and 206 and 207, respectively, which are perpendicular to the associated beams.

FIGS. 20a and 20b show the detection block of the double focus detection device in vertical and horizontal cross-sections. This block comprises a lens 210 and a lens 211 which jointly form a telecentric system imaging the gratings 187 and 188 on different parts of a detector 215. If desired, a mirror 212 may be provided, which mirror deflects the beams upwards (Z direction) and thus has a function reverse to that of the mirror 160 (FIG. 18).

A polarization modulator 220 switching the direction of polarization of the beams through 90° and an analyser 225 passing only radiation of a given direction of polarization towards the detector 215 are arranged between the lenses 210 and 211. The modulator may be formed by a quartz crystal 221 with a $\lambda/4$ plate 222, 223 at both sides thereof. This modulator is preferably arranged in the pupil of the lens system 210, 211.

Figure 21:
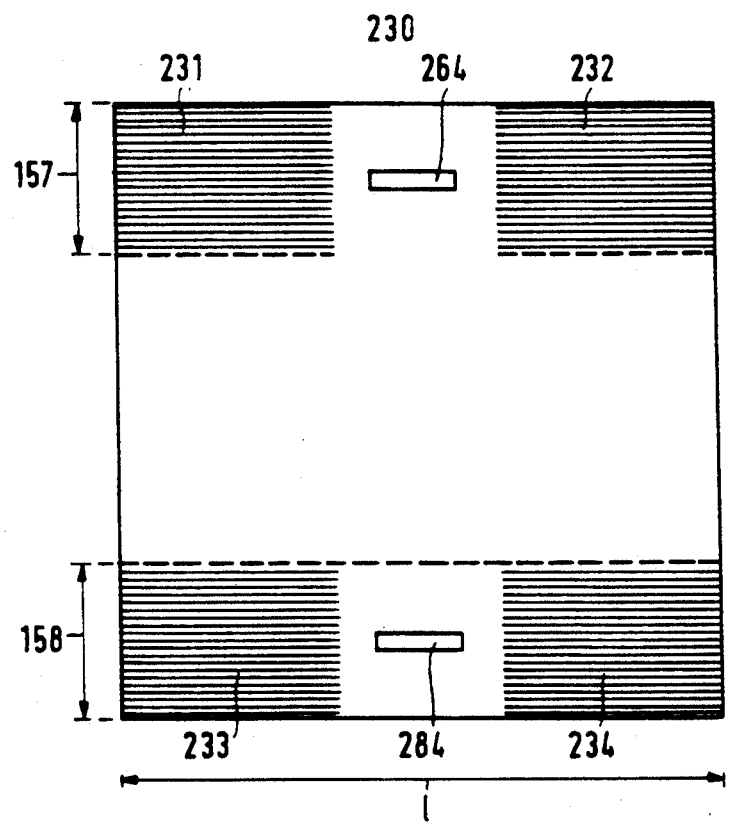
FIG. 21 shows an embodiment of a grating plate used in this device.

In FIGS. 18, 19 and 20 it has been shown as if the focus detection beam and the reference beam are incident on different gratings 157, 158 and 187, 188, respectively. The gratings 157 and 158, and 187 and 188 are preferably two separate parts of a first composite grating and a second composite grating, respectively. Such a composite grating 230 arranged on the plate 150 is shown in FIG. 21. The grating on the plate 180 has the same geometry. As is shown in FIG. 21, the grating parts 157 and 158 may in their turn be divided into a left-hand part and a right-hand part so that there is a total number of four grating parts. The grating parts 231 and 232 cooperate with the focus detection beam and the grating parts 233 and 234 cooperate with the reference beam. The length 1 of the composite grating 230 is such that the length of the image thereof on the substrate is slightly smaller than the length of a substrate field, so that the grating parts are imaged as much as possible at the edges of this substrate field.

Figure 22:
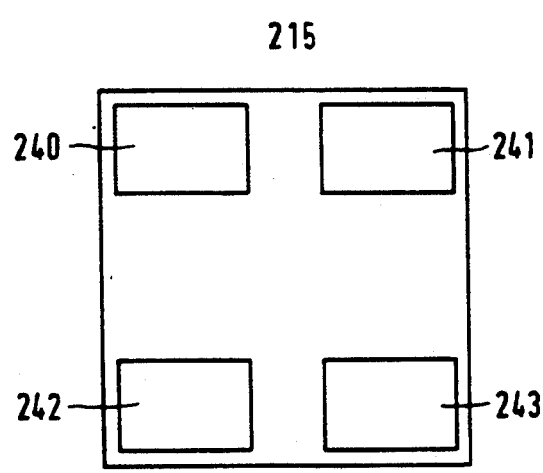
FIG. 22 shows an embodiment of a radiation-sensitive detector used in this device.

The detector 215 on which the grating parts of the first grating (157, 158) and of the second grating (187, 188) are imaged is then divided into four quadrants 240, 241, 242, 243 as is shown in FIG. 22. The tilt of the substrate about the X axis of FIG. 1 can be determined by comparing the signals of the detector parts 240 and 241, while the tilt of the reference plate RP about the X axis can be determined by comparing the signals of the detector parts 242 and 243. To determine the tilts of the substrate and of the reference plate about the Y axis, a second double focus detection device analogous to that shown in FIGS. 18, 19 and 20 must be used. This second device is preferably arranged at an angle of 90° to the first device. A total number of two focus detection beams and two reference beams is then used instead of the four focus detection beams shown in FIG. 17. This FIG. 17 does not show any reference beams.

Due to changes of the ambient parameters such as air pressure, temperature and humidity the refractive index of the medium in which the elements of the projection lens system are present may change. As a result, the imaging qualities and the position of the image plane may vary. To compensate for these variations and to enable the operator of the apparatus to set said position, for example, with reference to experiments performed, the focus detection device may be provided with an adjustable compensation plate 250 (FIG. 19). This plate is arranged in the focus detection beam directly behind the first grating plate 150. The plate 250 is, for example, a glass plate and its thickness is also determined by that of the plates 200 and 205. By rotating the plate about an axis perpendicular to the plane of the drawing in FIG. 19a, the positions of the images of the left-hand and right-hand portions of the grating 157 can be shifted with respect to the detector portions, independent of the Z position of the substrate. The zero of the focus error signal derived from the detector signals can thus be set.

For the grating measuring system the range within which focus errors can be detected is determined by the period of the grating. For a grating period of, for example, 40 $\mu$m the capture range extends, for example, from −20 $\mu$m to +20 $\mu$m.

To increase the capture range, each grating of the focus detection device or the tilt detection device, for example, each of the gratings 231-234 of FIG. 21 may be divided into two sub-gratings whose grating periods are, for example, 10% different. In an analogous way as described for an alignment system in the article "Automatic Alignment System for Optical Projection Printing" in IEEE Transactions on Electron Devices Vol. ED-26, No. 4, 1979, pp. 723-728, signals having, for example, a ten times larger period can then be obtained for a focus detection device and a tilt detection device, which signals make it possible to detect errors which are ten times larger.

The present invention provides a further possibility of increasing the capture range in which it is also possible to test and/or calibrate. To this end, the device according to the invention is provided with a second focus detection system which operates without gratings and with an extra beam, for example, a laser beam. With this beam an extra radiation spot is formed on the substrate, which spot is small and is therefore well suitable for testing. This system will hereinafter be referred to as the auxiliary detection system. This system preferably also has a double construction with a first beam which is reflected by the substrate and a second beam which is projected by the reference plate of the projection lens system. The elements of the auxiliary detection system are shown in FIGS. 18, 19 and 20, with FIG. 20b only showing the chief rays of the two auxiliary beams $b_1$, $b_{1,1}$ in dot-and-dash lines for the sake of clarity.

The first part of the auxiliary detection system comprises a radiation source 260, for example, a diode laser combined with a collimator lens. The auxiliary beam $b_1$ is constricted by a telescopic lens system 261, 262 and is deflected by a wedge 263 towards the grating plate 150. This plate has a gap-shaped aperture for this beam, which aperture is denoted by 264 in FIG. 21. The aperture 264 is smaller than the beam cross-section in situ so that the aperture functions as a new radiation source. The width-height ratio of the gap-shaped aperture is chosen, for example, such that the image of this aperture on the substrate is square, as also holds for the gratings 157, 158 and their images on the substrate.

An extra wedge 154 may be provided on the grating plate so as to ensure that the beam from the aperture 264 is incident on the substrate W at a specific angle. On its way to the substrate the beam $b_1$ meets the same elements 250, 170, 190, 191 as the focus detection beam $b_f$. From the substrate to the second grating plate 180 the beam $b'_1$ meets the same elements 193, 192, 175, 205, 200 as the reflected focus detection beam $b'_f$. The auxiliary beam $b'_1$ exits through a special aperture structure from the grating plate and is imaged on a detector 273 by a lens system 271, 272. An optical wedge 270 giving the beam the right direction is arranged in front of this lens system. A further wedge 184 which is comparable to the wedge 154 on the grating plate 150 may be arranged on the grating plate.

Figure 23:
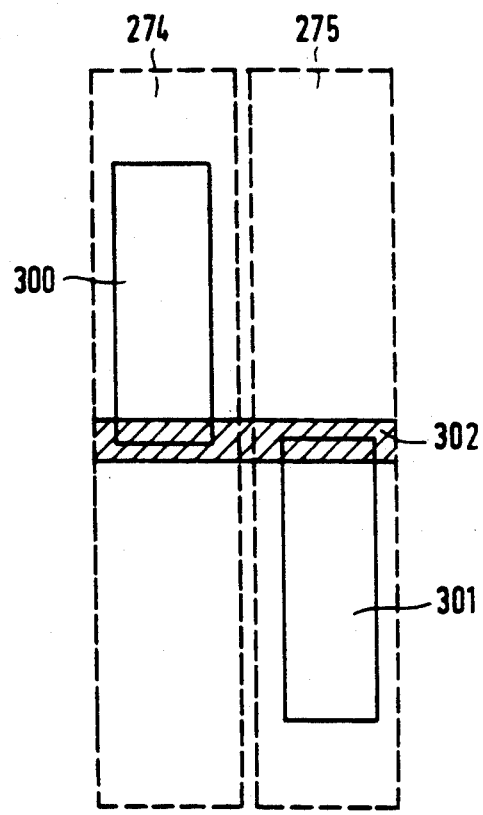
FIG. 23 shows the combination of apertures imaged onto each other and the associated detector of a laser detection system for larger focus errors.

The special aperture structure for the beam $b'_1$ on the grating plate 180 is formed by two rectangular apertures 300 and 301, as is shown in FIG. 23. The image of the aperture 264 formed thereon is denoted by 302. The radiation passed through each aperture is captured by a separate detector part of the detector 273. These detector parts 274 and 275 are shown by way of broken lines in FIG. 23. A focus error signal is obtained by comparing the signals of the detector parts 274 and 275. The detector 273 which is commonly referred to as a bi-cell detector is characterized in that the radiation-sensitive areas 274 and 275 are relatively large, whereas the distance between the strips is relatively small. The auxiliary detection system with said aperture structure on the grating plate 180 and with the bi-cell detector has the advantage that it is not necessary to impose stringent requirements on the tolerance or the stability of the elements.

The second part of the auxiliary detection system which operates with a beam $b_{1,r}$ reflected by the reference plate of the projection lens system comprises the elements 280, 281, 282, 283, 155, 170, 175, 207, 202, 185, 290, 291, 292 and 293 which are identical to and fulfil the same functions as the elements 260, 261, 262, 263, 154, 170, 175, 206, 201, 270, 271, 272 and 273 of the first part of this system.

The distance between the substrate and the projection lens system can be determined by comparing the output signals of the two auxiliary detection systems.

The average focus error per substrate field can be determined in the tilt detection device of FIGS. 18-20 by averaging the focus errors measured at the points a, b, c and d.

Figure 24:
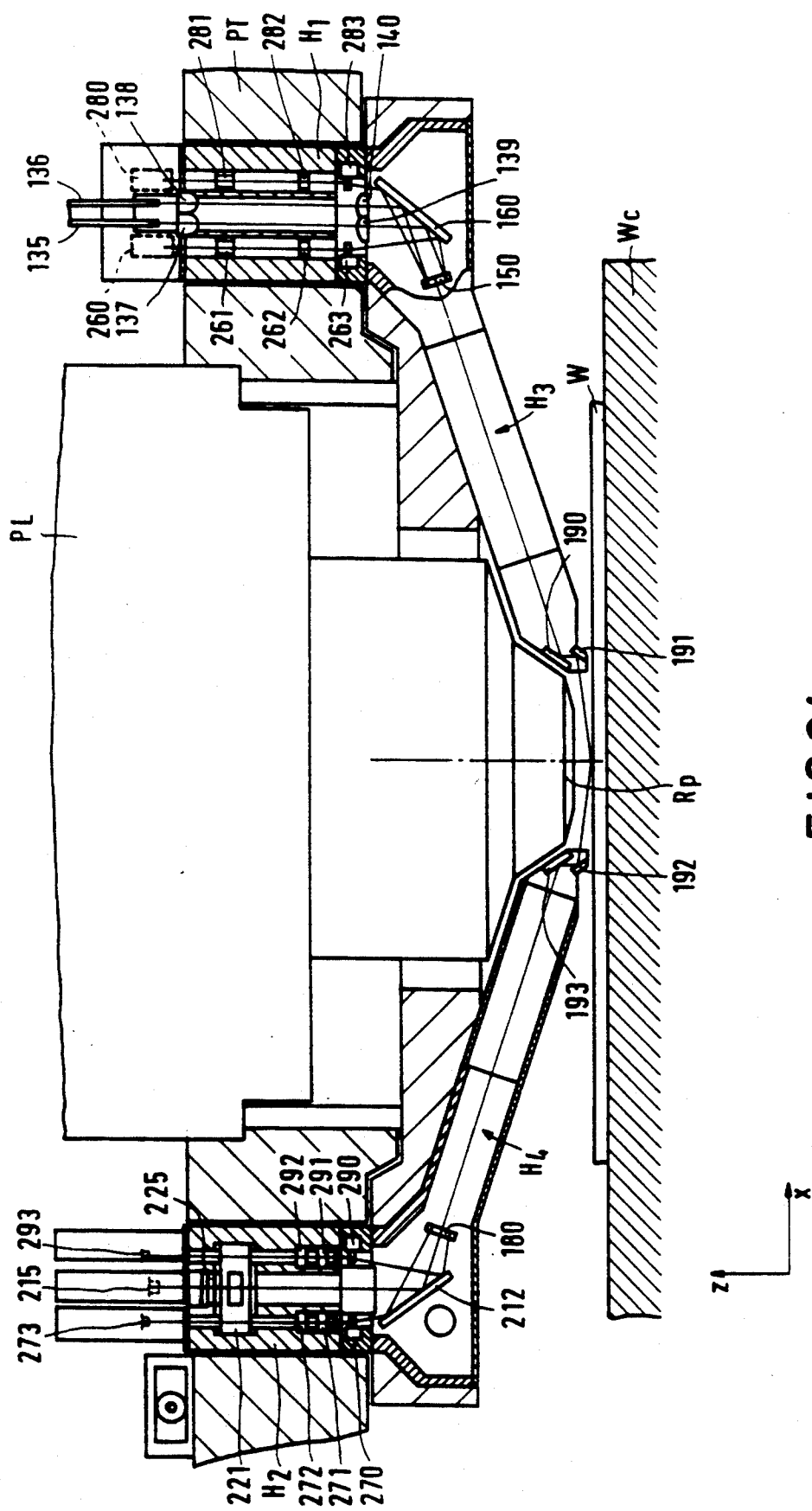
FIG. 24 shows the mechanical construction of a part of a pattern projection apparatus including a focus-error and tilt detection device.

To supplement the schematic representation of an apparatus for repetitively imaging a mask pattern on a substrate of FIG. 1, FIG. 24 shows details of the mechanical construction of the focus and tilt detection device and the way in which this device is connected to the projection lens system PL. This system is secured in a plate PT in which holders $H_1$ and $H_2$ are arranged at the right and left for the illumination part and the detection part, respectively. The illumination part accommodates the fiber ends 135, 136 for the supply of the wideband beams, the lenses 137, 138, 139 and 140 for these beams, the diode lasers 260, 280, the lenses 261, 262, 281, 282 and the wedges 263, 283 for the diode laser beams. The telecentric lens system 170 (not shown), the grating plate 150, the folding mirror 160 and the mirrors 190 and 191 are present in a holder $H_3$ which is secured to a mounting plate MP which in its turn is connected to the plate PT.

A similar holder $H_4$ is arranged at the left and accommodates the mirrors 192 and 193, the telecentric lens system 175 (not shown), the grating plate 180 and the folding mirror 212. The holder $H_4$, which is secured in the plate PT, accommodates the modulator 221, the analyzer 225 and the detector for the wideband beam. The wedges 270, 290, the lenses 271, 272, 291 and 292 and the detectors 273, 293 are present for the laser beams.

The apparatus comprises a second focus error and tilt detection device with a second set of four holders arranged in front of and behind the plane of the drawing in FIG. 24, preferably in a plane perpendicular to the plane of the drawing. Only a tilt of the substrate about the Y axis is to be measured with the second device. The holders of the second device need only accommodate those optical elements of FIG. 24 which are present in the path of the wideband beams.

Figure 25:
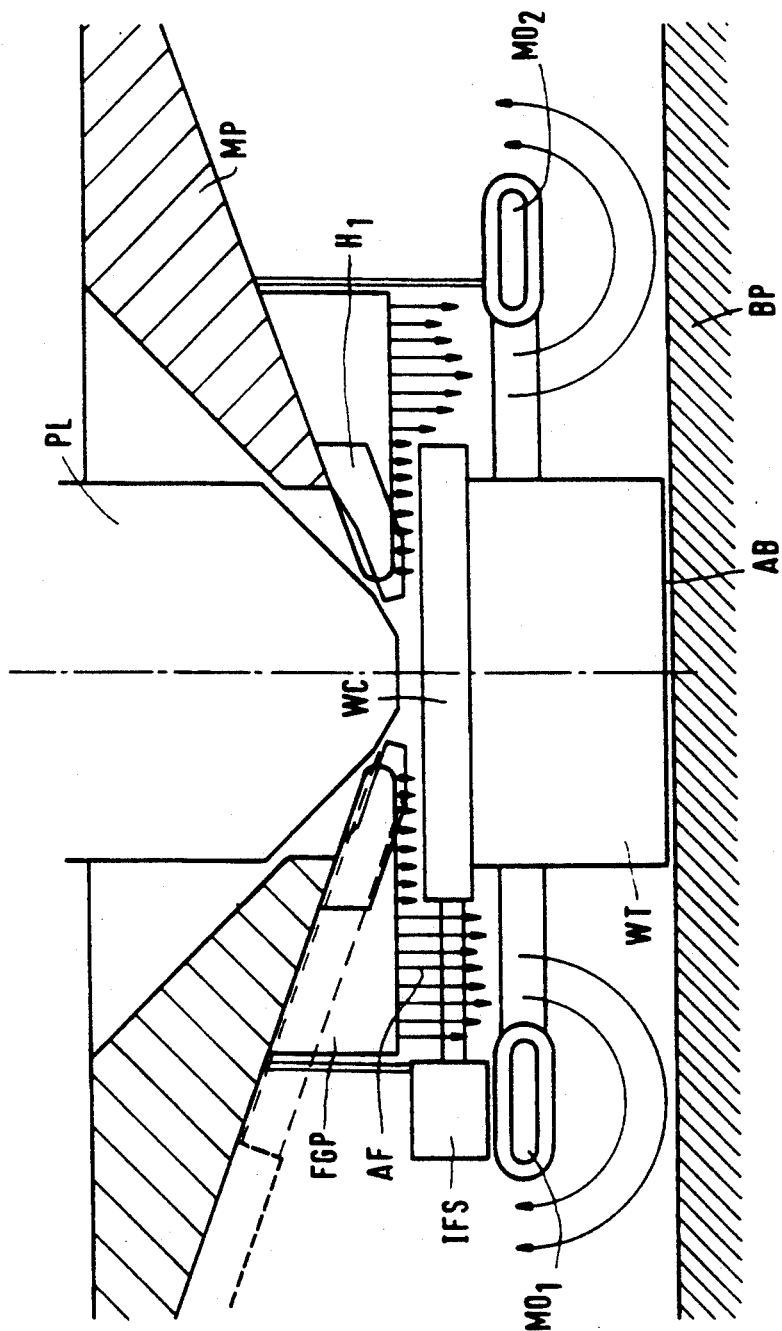
FIG. 25 shows a part of this apparatus with a stream of air for conditioning the space between the projection lens system and the substrate.

In an apparatus for repetitively imaging a mask pattern on a substrate it can be ensured that constant circumstances prevail in the space between the projection lens system and the substrate. This can be realized by passing a constant, preferably laminar stream of air through this space. This is illustrated in FIG. 25. This Figure diagrammatically shows a part of the projection lens system PL and the substrate support WC. The substrate support forms part of a substrate table WT which can move across a base plate BP via an air cushion AB under the control of an actuator system in a H configuration described in, for example, U.S. Pat. No. 4,665,594, whose components are denoted by $MO_1$ and $MO_2$ in FIG. 25. FIG. 25 again shows the holders $H_1$ and $H_2$ which are secured to the mounting plate MP, on which plate the interferometer system shown in FIG. 1 and illustrated in FIG. 25 only diagrammatically by means of IFS is preferably also secured. Said air stream is denoted by the arrows AF. This air stream is passed through an air stream conducting plate FGP. This plate may be dimensioned in such a way that the space above the substrate to be illuminated is covered so that the beams of the focus error and tilt detection device but also the substrate are present in a well-conditioned space.

Both the purity and the temperature of the supplied air can be controlled. This air is, for example, of purity class 1 and its temperature is, for example, stable within 0.1° C. The latter can be achieved by arranging a heat exchanger in the vicinity of the substrate support.

The invention has been described with reference to its use in an apparatus for repetitively imaging a mask pattern on a substrate, for the manufacture of, for example, integrated circuits (ICs), integrated optical systems or planar optical systems, guidance and detection patterns for magnetic domain memories or of a structure of liquid crystal display panels. Although in the first instance the invention is intended for these uses, it is not limited thereto. It can generally be used in optical measuring and inspection apparatuses in which the position of an imaging lens system or another reference and/or the tilt of this surface must be determined very accurately. These may be apparatuses for manufacturing patterns such as IC patterns, LCD patterns, etc. which operate with a laser beam or an electron beam, pattern projection apparatuses which operate with X-ray radiation, or accurate measuring apparatuses, for example, those used for measuring masks or substrates.

We claim:

1. An imaging apparatus comprising an imaging system and an opto-electronic focus detection system for determining a deviation between the image plane of the imaging system and a second plane on which imaging is to take place, said focus detection system comprising a radiation source for supplying a focus detection beam, a radiation-sensitive detector arranged at the same side of the second plane as the radiation source, and optical elements for directing the focus detection beam onto the second plane at a small angle to said plane for changing the vergency of said beam and of that of the beam reflected by the second plane and for directing the last-mentioned beam onto the detector, characterized in that the focus detection beam has a wide wavelength band and in that a first and a second grating are provided, the first grating being arranged in the radiation path between the radiation source and the second plane and the second grating being arranged between said second plane and the detector.

2. An imaging apparatus as claimed in claim 1, characterized in that means are provided for periodically moving, with respect to each other, the image of the first grating and the second grating perceived by the detector.

3. An imaging apparatus as claimed in claim 2, characterized in that an optical element controlled by a periodical electric signal is arranged in the path of the focus detection beam, an optical property of said element varying periodically under the influence of the electric signal.

4. An imaging apparatus as claimed in claim 3, characterized in that a polarization-sensitive element is arranged in front of the second grating for splitting the focus detection beam into two sub-beams which form images of the first grating in the plane of the second grating, said images being shifted with respect to each other over a distance which is smaller than the grating period of the second grating, in that a polarization rotator is arranged between the second grating and the detector, which rotator is controlled by a periodical signal for periodically varying the direction of polarization of the sub-beams, and in that a polarization analyzer is arranged between the polarization rotator and the detector, the periodical signal being also applied to an electronic circuit for processing the output signal of the detector to a focus control signal.

5. An imaging apparatus as claimed in claim 1, characterized in that a retroreflector is arranged in the path of the focus detection beam reflected a first time by the second plane, which retroreflector reflects said beam along itself, and in that a beam-separating element is arranged between the second plane and the radiation source in the path of the focus detection beam reflected a second time by the second plane, said beam-separating element coupling out the twice-reflected beam towards the second grating and the detector arranged behind it.

6. An imaging apparatus comprising an imaging system and an opto-electronic focus error detection system for determining a deviation between the image plane of the imaging system and a second plane on which imaging is to take place, said focus error detection system comprising a radiation source for supplying a focus detection beam, a radiation-sensitive detector arranged at the same side of the second plane as the radiation source, and optical elements for directing the focus detection beam onto the second plane at a small angle to said plane for changing the vergency of said beam and of that of the beam reflected by the second plane and for directing the last-mentioned beam onto the detector, characterized in that a reference beam is provided which is directed onto a surface of the imaging system located opposite the second plane and extends at a small angle to said surface, and a second detector arranged in the path of the reference beam reflected by the surface, a first and a second grating being arranged in the path of the reference beam, and the optical means arranged between the first grating and the second grating for directing and changing the vergency being common for the two beams.

7. An imaging apparatus as claimed in claim 6, characterized in that means are provided for the focus detection beam and the reference beam for periodically moving, with respect to each other, the image of the first grating and the second grating which are perceived by the detector for the relevant beam.

8. An imaging apparatus as claimed in claim 7, characterized in that an optical element controlled by a periodical electric signal is arranged in the paths of the focus detection beam and the reference beam, an optical property of said element varying periodically under the influence of the electric signal.

9. An imaging apparatus as claimed in claim 8, characterized in that a polarization-sensitive element is arranged in front of the second grating in the paths of the focus detection beam and the reference beam for splitting each focus detection beam and reference beam into two sub-beams which form images of the first grating in the plane of the second grating, said images being shifted with respect to each other over a distance which is smaller than the grating period of the second grating, in that a polarization rotator is arranged between a second grating and a detector for periodically varying the direction of polarization of the sub-beams, and in that a polarization analyzer is arranged between the polarization rotator and the detector, the periodical signal being also applied to an electronic circuit for processing the output signal of the detectors to a focus error signal.

10. An imaging apparatus as claimed in claim 6, characterized in that a separate radiation source for supplying the reference beam is provided, in that a first beam-deflecting element is arranged between the radiation sources and the second plane in the path of the focus detection beam as well as of the reference beam for directing said beams onto the second plane and the surface, respectively, of the imaging system, and in that a second beam-deflecting element is arranged between the second surface and the two detectors in the path of the focus detection beam as well as of the reference beam for directing said beams onto the first and the second detector, respectively.

11. An imaging apparatus as claimed in claim 6, characterized in that a separate radiation source is provided for supplying the reference beam, in that a beam-deflecting element is arranged between the radiation sources and the second plane in the path of the focus detection beam as well as of the reference beam, in that a retroreflector is arranged in the path of the focus detection beam reflected a first time by the second plane and of the reference beam reflected a first time by the surface of the imaging system, and in that a first beam-separating element for coupling out the focus detection beam towards the first detector is arranged in the path of said beam reflected a second time by the second plane, while a second beam-separating element for coupling out the reference beam towards the second detector is arranged in the path of said beam reflected a second time by the surface of the imaging system.

12. An imaging apparatus as claimed in claim 6, characterized in that a first birefringent element is arranged in the path of the beam supplied by the radiation source for splitting said beam into a focus detection beam having a first direction of polarization and a reference beam having a second direction of polarization and for directing said beams onto the second plane and the surface of the imaging system, respectively, and in that a second birefringent element is arranged in the paths of the beams reflected by the second plane and the surface of the imaging system, respectively, for deflecting the two beams towards each other and for directing the beams onto the first detector and the second detector, respectively.

13. An imaging apparatus as claimed in claim 6, characterized in that a composite reflector is arranged in the path of the focus detection beam reflected by the second plane, in that the reference beam is formed by the beam reflected by the reflector and directed onto the surface of the imaging system and in that the first and the second detector are combined in one detector.

14. An imaging apparatus as claimed in claim 13, characterized in that a beam-deflecting element is arranged in the common path of the beam supplied by the radiation source and the beam reflected by the surface of the imaging system for deflecting the first-mentioned beam towards the second plane and for deflecting the last-mentioned beam towards the detector.

15. An imaging apparatus as claimed in claim 6, characterized in that a first birefringent element is arranged in the path of the beam supplied by the radiation source, which element passes said beam as a focus detection beam towards the second plane, in that a second birefringent element is arranged in the path of the beam reflected by said plane, which element passes the reflected beam, in that a retroreflector reflecting the beam towards the second birefringent element is arranged in the path of the passed beam, which element deflects the beam as a reference beam towards the surface of the imaging system, and in that the first birefringent element deflects the beam refleted by said surface into the direction of the beam supplied by the radiation source.

16. An imaging apparatus as claimed in claim 5, characterized in that the focus detection beam has a wide wavelength band, in that a first grating is arranged in the radiation path of the focus detection beam as well as of the reference beam between the source supplying the relevant beam and the plane on which said beam is reflected for the first time, and in that a second grating is arranged between the detector for the relevant beam and a plane reflecting said beam towards the detector.

17. An imaging apparatus as claimed in claim 10, characterized in that the radiation source supplies a beam having a wide wavelength band and in that a first grating is arranged between said source and the first deflection element and a second grating is arranged between the second deflection element and the detector.

18. An imaging apparatus as claimed in claim 11, characterized in that the focus detection beam has a wide wavelength band, in that a first grating is arranged between the radiation sources and the first deflection element, in that a second grating is arranged between the beam-deflecting element and the first detector in the radiation path of the reflected focus detection beam and in that a third grating is arranged between the beam-deflecting element and the second detector in the radiation path of the reflected reference beam.

19. An imaging apparatus as claimed in claim 12, characterized in that the radiation source supplies a beam having a wide wavelength band, and in that a first grating is arranged between the radiation source and the first birefringent element and a second grating is arranged between the second birefringent element and the detector.

20. An imaging apparatus as claimed in claim 13, characterized in that the radiation source supplies a beam having a wide wavelength band and in that a first grating is arranged between the radiation source and the second plane in the radiation path of said beam and a second grating is arranged between the surface of the imaging system and the detector.

21. An imaging apparatus as claimed in claim 15, characterized in that the radiation source supplies a beam having a wide wavelength band and in that a first grating is arranged between the source and the first birefringent element in the radiation path of said beam and a second grating is arranged between said element and the detector.

22. An imaging apparatus as claimed in claim 1, characterized in that an adjustable optical element is arranged in front of the second plane in the radiation path of the focus detection beam for displacing, independently of a focus error, the radiation spot formed in the second plane for changing the zero of the generated focus error signal.

23. An imaging apparatus as claimed in claim 1, characterized in that it comprises a first and a second detection unit for determining tilts of the second plane about two mutually perpendicular X and Y axes, each detection unit comprising a radiation source, a first and a second grating and a detector, the optical axis of the first unit being located in the XZ plane and the optical axis of the second unit being located in the YZ plane, and in that in each unit a first lens system is arranged between the first grating and the second plane for converting the beam from the grating into a parallel beam, while a second lens system is arranged between the second plane and the second grating for converting the parallel beam into a converging beam.

24. An imaging apparatus as claimed in claim 23, characterized in that each detection unit comprises means for forming a reference beam which is directed onto a surface of the imaging system located opposite the second plane and extends at a small angle to said surface, and a second detector which is arranged in the path of the reference beam reflected by the surface of the imaging system.

25. An imaging apparatus as claimed in claim 1, characterized in that means for supplying at least two extra focus detection beams similar to said focus detection beam are provided for detecting tilts of the second plane about two mutually perpendicular X and Y axes of the image plane, in that each focus detection beam is directed onto a separate point of the second plane, at least two points taking up different X positions and at least two points taking up different Y positions.

26. An imaging apparatus as claimed in claim 25, characterized by two separate focus detection units with two focus detection beams each, the detector signals of the two focus detection units jointly comprising information about the tilt of the second plane about the X axis and the Y axis.

27. An imaging apparatus as claimed in claim 1, characterized in that each grating is divided into two sub-gratings which have different grating periods.

28. An imaging apparatus as claimed in claim 1, in which the focus detection beams have wide bands and traverse gratings, characterized in that an additional, bright radiation source is provided for supplying an extra, monochromatic, focus detection beam for forming an extra radiation spot in the second plane.

29. An imaging apparatus as claimed in claim 28, characterized by an additional, bright, monochromatic, reference beam for forming an extra radiation spot on the surface of the imaging system.

30. An imaging apparatus as claimed in claim 23, characterized in that in each detection unit the optical elements in the radiation path between the gratings are common for all focus detection beams and reference beams.

31. An imaging apparatus as claimed in claim 28, characterized in that the wavelength of the monochromatic focus detection beam and reference beam is located in the wavelength band of the other focus detection beams and reference beams.

32. An imaging apparatus as claimed in claim 25, characterized in that within a focus detection unit two focusing beams are formed by one beam two parts of which are incident on two different grating parts.

33. An imaging apparatus as claimed in claim 28, characterized in that two grating parts of the first grating and of the second grating are arranged on a first grating plate and on a second grating plate, respectively, and in that the first grating plate has one first aperture for the monochromatic beam and the second grating plate has two second apertures for said beam, said second apertures being located symmetrically with respect to the first aperture.

34. A projection apparatus for repetitively imaging a mask pattern on a substrate, comprising an imaging apparatus as claimed in claim 1, in which the imaging lens system is formed by an optical projection lens system with which the pattern is projected onto the substrate, and the second plane is formed by the surface of a substrate layer to be exposed, the signals of the focus detection system being used for setting the distance between the substrate and the projection lens system and/or the angle between the image plane of said lens system and said surface.

35. An imaging apparatus as claimed in claim 2, characterized in that a retroreflector is arranged in the path of the focus detection beam reflected a first time by the second plane, which retroreflector reflects said beam along itself, and in that a beam-separating element is arranged between the second plane and the radiation source in the path of the focus detection beam reflected a second time by the second plane, said beam-separating element coupling out the twice-reflected beam towards the second grating and the detector arranged behind it.

36. An imaging apparatus as claimed in claim 2, characterized in that a separate radiation source for supplying the reference beam is provided, in that a first beam-deflecting element is arranged between the radiation sources and the second plane in the path of the focus detection beam as well as of the reference beam for directing said beams onto the second plane and the surface, respectively, of the imaging system, and in that a second beam-deflecting element is arranged between the second surface and the two detectors in the path of the focus detection beam as well as of the reference beam for directing said beams onto the first and the second detector, respectively.

37. An imaging apparatus as claimed in claim 2, characterized in that a separate radiation source is provided for supplying the reference beam, in that a beam-deflecting element is arranged between the radiation sources and the second plane in the path of the focus detection beam as well as of the reference beam, in that a retroreflector is arranged in the path of the focus detection beam reflected a first time by the second plane and of the reference beam reflected a first time by the surface of the imaging system, and in that a first beam-separating element for coupling out the focus detection beam towards the first detector is arranged in the path of said beam reflected a second time by the second plane, while a second beam-separating element for coupling out the reference beam towards the second detector is arranged in the path of said beam reflected a second time by the surface of the imaging system.

38. An imaging apparatus as claimed in claim 2, characterized in that a first birefringent element is arranged in the path of the beam supplied by the radiation source for splitting said beam into a focus detection beam having a first direction of polarization and a reference beam having a second direction of polarization and for directing said beams onto the second plane and the surface of the imaging system, respectively, and in that a second birefringent element is arranged in the paths of the beams reflected by the second plane and the surface of the imaging system, respectively, for reflecting the two beams towards each other and for directing the beams onto the first detector and the second detector, respectively.

39. An imaging apparatus as claimed in claim 2, characterized in that a composite reflector is arranged in the path of the focus detection beam reflected by the second plane, in that the reference beam is formed by the beam reflected by the reflector and directed onto the surface of the imaging system and in that the first and the second detector are combined in one detector.

40. An imaging apparatus as claimed in claim 2, characterized in that a first birefringent element is arranged in the path of the beam supplied by the radiation source, which element passes said beam as a focus detection beam towards the second plane, in that a second birefringent element is arranged in the path of the beam reflected by said plane, which element passes the reflected beam, in that a retroreflector reflecting the beam towards the second birefringent element is arranged in the path of the passed beam, which element deflects the beam as a reference beam towards the surface of the imaging system, and in that the first birefringent element deflects the beam reflected by said surface into the direction of the beam supplied by the radiation source.

41. An imaging apparatus as claimed in claim 2, characterized in that the focus detection beam has a wide wavelength band, in that a first grating is arranged in the radiation path of the focus detection beam as well as of the reference beam between the source supplying the relevant beam and the plane on which said beam is reflected for the first time, and in that second grating is arranged between the detector for the relevant beam and a plane reflecting said beam towards the detector.

42. An imaging apparatus as claimed in claim 2, characterized in that it comprises a first and a second detection unit for determining tilts of the second plane about two mutually perpendicular X and Y axes, each detection unit comprising a radiation source, a first and a second grating and a detector, the optical axis of the first unit being located in the XZ plane and the optical axis of the second unit being located in the YZ plane, and in that in each unit a first lens system is arranged between the first grating and the second plane for converting the beam from the grating into a parallel beam, while a second lens system is arranged between the second plane and the second grating for converting the parallel beam into a converging beam.

43. An imaging apparatus as claimed in claim 6, characterized in that each grating is divided into two sub-gratings which have different grating periods.

44. An imaging apparatus as claimed in claim 6, in which the focus detection beams have wide bands and traverse gratings, characterized in that an additional, bright radiation source is provided for suppling an extra, monochromatic, focus detection beam for forming an extra radiation spot in the second plane.

45. An imaging apparatus as claimed in claim 23, characterized in that each grating is divided into two sub-gratings which have different grating periods.

46. An imaging apparatus as claimed in claim 23, in which the focus detection beams have wide bands and traverse gratings, characterized in that an additional, bright radiation source is provided for suppling an extra, monochromatic, focus detection beam for forming an extra radiation spot in the second plane.

47. An imaging apparatus as claimed in claim 25, characterized in that each grating is divided into two sub-gratings which have different grating periods.

48. An imaging apparatus as claimed in claim 27, in which the focus detection beams have wide bands and traverse gratings, characterized in that an additional, bright radiation source is provided for suppling an extra, monochromatic, focus detection beam for forming an extra radiation spot in the second plane.

49. An imaging apparatus as claimed in claim 25, characterized in that in each detection unit the optical elements in the radiation path between the gratings are common for all focus detection beams and reference beams.

50. An imaging apparatus as claimed in claim 27, characterized in that in each detection unit the optical elements in the direction path between the gratings are common for all focus detection beams and reference beams.

51. A projection apparatus for repetitively imaging a mask pattern on a substrate, comprising an imaging apparatus as claimed in claim 6, in which the imaging lens system is formed by an optical projection lens system with which the pattern is projected onto the substrate, and the second plane is formed by the surface of a substrate layer to be exposed, the signals of the focus detection system being used for setting the distance between the substrate and the projection lens system and/or an angle between the image plane of said lens system and said surface.

52. A projection apparatus for repetitively imaging a mask pattern on a substrate, comprising an imaging apparatus as claimed in claim 25, in which the imaging lens system is formed by an optical projection lens system with which the pattern is projected onto the substrate, and the second plane is formed by the surface of a substrate layer to be exposed, the signals of the focus detection system being used for setting the distance between the substrate and the projection lens system and/or an angle between the image plane of said lens system and said surface.

* * * * *